US011533054B2

United States Patent
Kang et al.

(10) Patent No.: US 11,533,054 B2
(45) Date of Patent: Dec. 20, 2022

(54) TERNARY LOGIC CIRCUIT DEVICE

(71) Applicant: POSTECH Research and Business Development Foundation, Pohang-si (KR)

(72) Inventors: Seokhyeong Kang, Pohang-si (KR); Sunmean Kim, Pohang-si (KR); SungYun Lee, Busan (KR); Sunghye Park, Daegu (KR)

(73) Assignee: POSTECH Research and Business Development Foundation, Pohang-si (KR)

( * ) Notice: Subject to any disclaimer, the term of this patent is extended or adjusted under 35 U.S.C. 154(b) by 0 days.

(21) Appl. No.: 17/489,624

(22) Filed: Sep. 29, 2021

(65) Prior Publication Data

US 2022/0352893 A1   Nov. 3, 2022

(30) Foreign Application Priority Data

Apr. 29, 2021   (KR) .................. 10-2021-0055864

(51) Int. Cl.
  *G06F 7/50*       (2006.01)
  *H03K 19/0944*    (2006.01)
  *H03K 19/20*      (2006.01)
  *G06F 7/46*       (2006.01)

(52) U.S. Cl.
  CPC ......... *H03K 19/0944* (2013.01); *G06F 7/461* (2013.01); *H03K 19/20* (2013.01)

(58) Field of Classification Search
  CPC ..................... H03K 19/0944; H03K 19/20
  See application file for complete search history.

(56) References Cited

U.S. PATENT DOCUMENTS

| | | | | |
|---|---|---|---|---|
| 3,210,529 A | * | 10/1965 | Hanson ................. | G06F 7/4824 708/670 |
| 3,514,584 A | * | 5/1970 | Claude ..................... | G06F 7/49 326/53 |
| 3,525,077 A | * | 8/1970 | Jablonski ................ | G06F 11/10 710/316 |
| 4,803,649 A | * | 2/1989 | Holzapfel ............ | H03K 19/215 708/702 |

(Continued)

OTHER PUBLICATIONS

P. S. Peercy, "The drive to miniaturization," Nature, vol. 406, No. 6799, pp. 1023-1026, Aug. 2000.

(Continued)

*Primary Examiner* — Kurtis R Bahr
(74) *Attorney, Agent, or Firm* — Morgan, Lewis & Bockius LLP

(57) ABSTRACT

A circuit includes a plurality of first counting gates, a first ternary half adder (THA) and a second THA that are connected to the plurality of first counting gates, a third THA configured to receive a sum output signal of the first THA and a sum output signal of the second THA, a first ternary sum gate configured to receive a carry output signal of the first THA and a carry output signal of the second THA, and a second ternary sum gate configured to receive a carry output signal of the third THA and an output signal of the first ternary sum gate, wherein the third THA and the second ternary sum gate may be configured to output voltage signals corresponding to a number of drain voltages among input signals applied to the plurality of first counting gates.

7 Claims, 19 Drawing Sheets

(56) References Cited

U.S. PATENT DOCUMENTS

| | | | |
|---|---|---|---|
| 7,565,388 B1* | 7/2009 | Baeckler | G06F 7/509 708/235 |
| 2012/0290819 A1* | 11/2012 | Langhammer | G06F 7/5443 712/222 |

OTHER PUBLICATIONS

R. Ho, K. W. Mai, and M. A. Horowitz, "The future of wires," Proc. IEEE, vol. 89, No. 4, pp. 490-504, Jul. 2001.

G. Yeap, "Smart mobile SoCs driving the semiconductor industry: Technology trend, challenges and opportunities," in IEDM Tech, Dig., Dec. 2013, pp. 1.3.1-1.3.8.

N. Magen, A. Kolodny, U. Weiser, and N. Shamir, "Interconnect-power dissipation in a microprocessor," in Proc. Int. workshop Syst. Level Interconnect Predict., 2004, pp. 7-13.

Y. Taur, "CMOS design near the limit of scaling," IBM J. Res. Develop., vol. 46, No. 2.3, pp. 213-222, Mar. 2002.

S. Iijima and T. Ichihashi, "Single-shell carbon nanotubes of 1-nm diameter," Nature, vol. 363, No. 6430, pp. 603-605, Jun. 1993.

R. H. Baughman, "Carbon nanotubes—The route toward applications," Science, vol. 297, No. 5582, pp. 787-792, Aug. 2002.

V. Gaudet, "A survey and tutorial on contemporary aspects of multiplevalued logic and its application to microelectronic circuits," IEEE J. Emerg. Sel. Topics Circuits Syst., vol. 6, No. 1, pp. 5-12, Mar. 2016.

L. Hurst, "Multiple-valued logic—Its status and its future," IEEE Trans. Comput., vols. C-33, No. 12, pp. 1160-1179, Dec. 1984.

K. C. Smith, "A multiple valued logic: A tutorial and appreciation," Computer, vol. 21, No. 4, pp. 17-27, Apr. 1988.

X. W. Wu and F. P. Prosser, "CMOS ternary logic circuits," IEE Proc. G Circuits, Devices Syst., vol. 137, No. 1, pp. 21-27, 1990.

A. Raychowdhury and K. Roy, "Carbon-nanotube-based voltage-mode multiple-valued logic design," IEEE Trans. Nanotechnok, vol. 4, No. 2, pp. 168-179, Mar. 2005.

Y. Kang et al., "A novel ternary multiplier based on ternary CMOS compact model," in Proc. IEEE 47th Int. Symp, Multiple-Valued Log, (ISMVL), May 2017, pp. 25-30.

S. Heo et al., "Ternary full adder using multi-threshold voltage graphene barristors," IEEE Electron Device Lett., vol. 39, No. 12, pp. 1948-1951, Dec. 2018.

H. Yoo et al., "Negative transconductance heterojunction organic transistors and their application to full-swing ternary circuits," Adv. Mater., vol. 31, No. 29, Jul. 2019.

L. Lee et al., "ZnO composite nanolayer with mobility edge Quantization for multi-value logic transistors," Nature Commun., vol. 10, No. 1, p. 1998, 2019.

S. Kim, S.-Y. Lee, S. Park, and S. Kang, "Design of quad-edge-triggered sequential logic circuits for ternary logic," in Proc. IEEE 49th Int. Symp. Multiple-Valued Log. (ISMVL), May 2019, pp. 37-42.

J. W. Jeong et al., "Tunnelling-based ternary metal-oxide-semiconductor technology," Nature Electron., vol. 2, No. 7, pp. 307-312, 2019.

A. Heung and H. T. Mouftah, "Depletion/enhancement CMOS for a lower power family of three-valued logic circuits," IEEE J. Solid-State Circuits, vol. 20, No. 2, pp. 609-616, Apr. 1985.

R. A. Jaber, A. Kassem, A. M. El-Hajj, L. A. El-Nimri, and A. M. Haidar, "High-performance and energy-efficient CNFETbased designs for ternary logic circuits," IEEE Access, vol. 7, pp. 93871-93886, 2019.

S. Lin, Y.-B. Kim, and F. Lombardi, "A novel CNTFET-based ternary logic gate design," in Proc. 52nd IEEE Int. Midwest Symp. Circuits Syst., Aug. 2009, pp. 435-438.

J. Deng and H.-S.-P. Wong, "A compact SPICE model for carbon-nanotube field-effect transistors including nonidealities and its application—Part I: Model of the intrinsic channel region," IEEE Trans. Electron Devices, vol. 54, No. 12, pp. 3186-3194, 2007.

J. Deng et al., A compact SPICE model for carbon-nanotube field-effect transistors including nonidealities and its application—Part II: Full device model and circuit perfoimance benchmarking, IEEE Trans. Electron Devices, vol. 54, No. 12 2007.

S. Lin, Y.-B. Kim, and F. Lombardi, "CNTFET-based design of ternary logic gates and arithmetic circuits," IEEE Trans. Nanotechnok, vol. 10, No. 2, pp. 217-225, Mar. 2011.

B. Srinivasu and K. Sridharan, "A synthesis methodology for ternary logic circuits in emerging device technologies," IEEE Trans. Circuits Syst. I, Reg. Papers, vol. 64, No. 8, pp. 2146-2159, Aug. 2017.

S. Kim, T. Lim, and S. Kang, "An optimal gate design for the synthesis of ternary logic circuits," in Proc. 23rd Asia South Pacific Design Autom. Conf. (ASP-DAC), Jan. 2018, pp. 476-481.

C. Vudadha, A. Surya, S. Agrawal, and M. B. Srinivas, "Synthesis of ternary logic circuits using 2:1 multiplexers," IEEE Trans. Circuits Syst. I, Reg. Papers, vol. 65, No. 12, pp. 4313-4325, Oct. 2018.

S.-Y. Lee, S. Kim, and S. Kang, "Ternary logic synthesis with modified Quine-McCluskey algorithm," in Proc. IEEE 49th Int. Symp. MultipleValued Log. (ISMVL), May 2019, pp. 158-163.

D. M. Miller and M. A. Thornton, Multiple Valued Logic: Concepts and Representations. San Rafael, CA, USA: Morgan & Claypool, 2008.

P. Dwivedi, K. Kumar, and A. Islam, "Comparative study of subthreshold leakage in CNFET & MOSFET 32-nm technology node," in Proc. Int. Conf. Microelectron., Comput. Commun, (MicroCom), Jan. 2016, pp. 1-5.

M. H. Moaiyeri, A. Doostaregan, and K. Navi, "Design of energy efficient and robust ternary circuits for nanotechnology," IET Circuits, Devices Syst., vol. 5, No. 4, pp. 285-296, 2011.

W. V. Quine, "The problem of simplifying truth functions," Amer. Math. Monthly, vol. 59, No. 8, pp. 521-531, Oct. 1952.

M. Hawash, M. Lukac, M. Kameyama, and M. Perkowski, Multiplevalued reversible benchmarks and extensible quantum specification (XQS) foimat, in Proc. IEEE 43rd Int. Symp. Multiple-Valued Log., May 2013, pp. 41-46.

* cited by examiner

TERNARY LOGIC CIRCUIT DEVICE

CROSS-REFERENCE TO RELATED APPLICATION(S)

This application claims the benefit of Korean Patent Application No. 10-2021-0055864, filed on Apr. 29, 2021, in the Korean Intellectual Property Office, the disclosure of which is incorporated herein by reference.

BACKGROUND

1. Field of the Invention

One or more example embodiments relate to technology for a ternary logic circuit device designed based on transistors.

2. Description of the Related Art

The performance of computing systems has been continuously improved through fine semiconductor processes. However, further performance improvement through the fine process is frustrated by an explosive increase in power density. To solve this issue, a multiple-valued logic has been proposed. A multiple-valued logic is a computing method that performs a computation using more than three logic states and has a great advantage of reducing area and power consumption compared to a binary logic. In particular, a ternary logic device may considerably lower the circuit complexity compared to a binary logic device. Hereinafter, a ternary logic circuit device for implementing various functions will be described.

SUMMARY

According to an aspect, there is provided a circuit including a plurality of first counting gates, a first ternary half adder (THA) and a second THA that are connected to the plurality of first counting gates, a third THA configured to receive a sum output signal of the first THA and a sum output signal of the second THA, a first ternary sum gate configured to receive a carry output signal of the first THA and a carry output signal of the second THA; and, a second ternary sum gate configured to receive a carry output signal of the third THA and an output signal of the first ternary sum gate, wherein the third THA and the second ternary sum gate may be configured to output voltage signals corresponding to a number of drain voltages among input signals applied to the plurality of first counting gates.

Each of the plurality of first counting gates may be configured to output a ground voltage when both input signals applied to the corresponding first counting gate are not drain voltages, output a drain voltage when both the input signals applied to the corresponding first counting gate are drain voltages, and output a half drain voltage when only one of the two input signals applied to the corresponding first counting gate is a drain voltage.

The circuit may further include a plurality of second counting gates, a fourth THA and a fifth THA that are connected to the plurality of second counting gates, a sixth THA configured to receive a sum output signal of the fourth THA and a sum output signal of the fifth THA, a third ternary sum gate configured to receive a carry output signal of the fourth THA and a carry output signal of the fifth THA, and a fourth ternary sum gate configured to receive a carry output signal of the sixth THA and an output signal of the third ternary sum gate.

Each of the plurality of second counting gates may be configured to output a ground voltage when both input signals applied to the corresponding second counting gate are not half drain voltages, output a drain voltage when both the input signals applied to the corresponding second counting gate are half drain voltages, and output a half drain voltage when only one of the two input signals applied to the corresponding second counting gate is a half drain voltage.

The circuit may further include a first multiplication gate, a second multiplication gate, a third multiplication gate, a fourth multiplication gate, a fifth multiplication gate, and a sixth multiplication gate, wherein the first multiplication gate, the second multiplication gate, the third multiplication gate, the fourth multiplication gate, the fifth multiplication gate, and the sixth multiplication gate may be configured to receive a sum output signal of the third THA and an output signal of the second ternary sum gate.

The circuit may further include an NNMIN gate configured to receive a plurality of input signals, a first multiplexer configured to selectively output one of a ground voltage and an output signal of the first multiplication gate received as input signals, based on an output signal of the NNMIN gate received as a selected signal, a second multiplexer configured to selectively output one of a ground voltage and an output signal of the second multiplication gate received as input signals, based on the output signal of the NNMIN gate received as the selected signal, a third multiplexer configured to selectively output one of a ground voltage and an output signal of the third multiplication gate received as input signals, based on the output signal of the NNMIN gate received as the selected signal, a fourth multiplexer configured to selectively output one of a ground voltage and an output signal of the fourth multiplication gate received as input signals, based on the output signal of the NNMIN gate received as the selected signal, a fifth multiplexer configured to selectively output one of a ground voltage and an output signal of the fifth multiplication gate received as input signals, based on the output signal of the NNMIN gate received as the selected signal, and a sixth multiplexer configured to selectively output one of a ground voltage and an output signal of the sixth multiplication gate received as input signals, based on the output signal of the NNMIN gate received as the selected signal.

The NNMIN gate may be configured to output a ground voltage when a minimum voltage among a plurality of input signals applied to the NNMIN gate is a ground voltage, and output a drain voltage when the minimum voltage among the plurality of input signals applied to the NNMIN gate is one of a half drain voltage and a drain voltage.

According to another aspect, there is provided a circuit including a plurality of NMIN gates, a plurality of standard ternary inverters (STIs) respectively connected to the plurality of NMIN gates, an NMAX gate configured to receive output signals of the plurality of STIs, and an STI configured to receive an output signal of the NMAX gate, wherein a predetermined number of input signals among a plurality of input signals applied to the circuit may be cyclically applied to the NMIN gate.

Each of the plurality of NMIN gates may be configured to output a drain voltage when a minimum voltage among a plurality of input signals applied to the corresponding NMIN gate is a ground voltage, output a half drain voltage when the minimum voltage among the plurality of input signals applied to the corresponding NMIN gate is a half drain voltage, and output a ground voltage when the minimum voltage among the plurality of input signals applied to the corresponding NMIN gate is a drain voltage.

The NMAX gate may be configured to output a drain voltage when a maximum voltage among a plurality of input signals applied to the NMAX gate is a ground voltage, output a half drain voltage when the maximum voltage among the plurality of input signals applied to the NMAX gate is a half drain voltage, and output a ground voltage when the maximum voltage among the plurality of input signals applied to the NMAX gate is a drain voltage.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
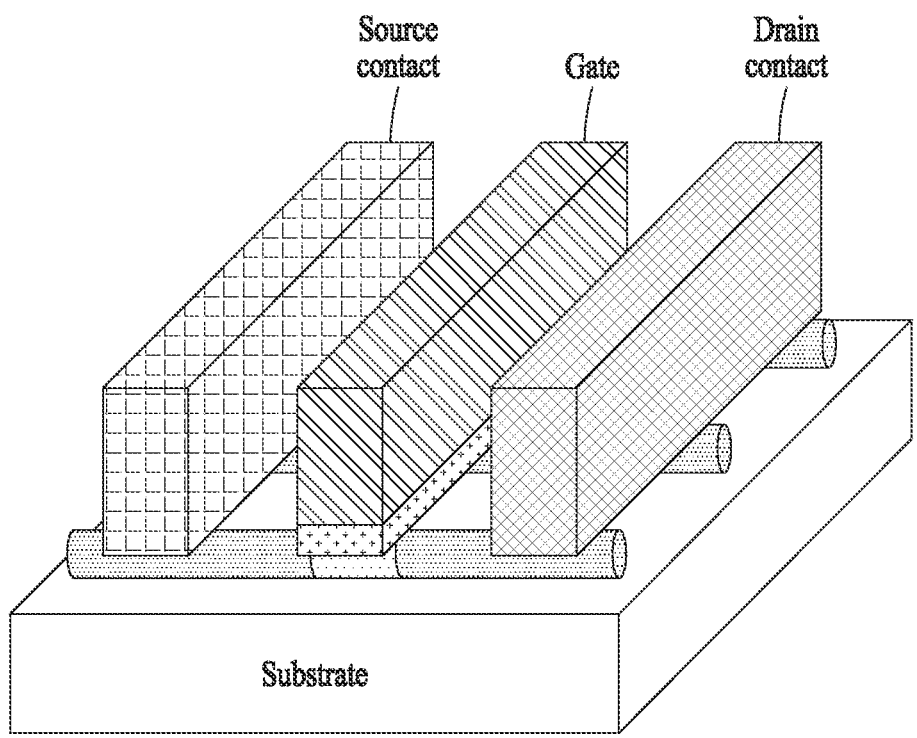
FIG. 1 illustrates a structure of a single-walled carbon nanotube field-effect transistor (CNTFET)

The following detailed structural or functional description is provided as an example only and various alterations and modifications may be made to the examples. Here, the examples are not construed as limited to the disclosure and should be understood to include all changes, equivalents, and replacements within the idea and the technical scope of the disclosure.

Terms, such as first, second, and the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

It should be noted that if it is described that one component is "connected", "coupled", or "joined" to another component, a third component may be "connected", "coupled", and "joined" between the first and second components, although the first component may be directly connected, coupled, or joined to the second component.

The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

Hereinafter, example embodiments will be described in detail with reference to the accompanying drawings. When describing the example embodiments with reference to the accompanying drawings, like reference numerals refer to like components and a repeated description related thereto will be omitted.

FIG. 1 illustrates a structure of a single-walled carbon nanotube field-effect transistor (CNTFET).

A single-walled carbon nanotube field-effect transistor (CNTFET) 100) is a field-effect transistor where a single-walled carbon nanotube (SWCNT) is inserted into a transistor. Hereinafter, a single-walled carbon nanotube field-effect transistor will be referred to as CNTFET.

A MOSFET-like CNTFET includes drain, gate, source, and body terminals. A carbon nanotube may operate as a conductor or a semiconductor according to a chiral vector. The chiral vector represents an angle of arrangement of carbon atoms. The chiral vector may be represented by (n, m), where n and m are integers. The chiral vector is a significant factor that determines a threshold voltage of the CNTFET. The threshold voltage of the CNTFET is inversely proportional to a diameter of the carbon nanotube. A relationship among the threshold voltage, the diameter of the carbon nanotube, and the element value n of the chiral vector may be expressed by Equation 1.

$$\frac{V_{t1}}{V_{t2}} = \frac{D_{CNT2}}{D_{CNT1}} = \frac{n_2}{n_1} \qquad [\text{Equation 1}]$$

In Equation 1, $V_{t1}$ and $V_{t2}$ denote threshold voltages of the CNTFET, $D_{CNT1}$ and $D_{CNT2}$ denote the diameters of the CNTFET, and $n_1$ and $n_2$ denote element values of the chiral vector.

The following Table 1 shows diameters and threshold voltages of carbon nanotubes according to respective chiral vectors. Three types of CNTFETs having different threshold voltages may be used for n-type and p-type transistors.

TABLE 1

| (n, m)  | $D_{CNT}$(nm) | $V_{tn}$(V) | $V_{tp}$(V) |
|---------|---------------|-------------|-------------|
| (17, 0) | 1.331         | 0.323       | −0.323      |
| (13, 0) | 1.017         | 0.428       | −0.428      |
| (8, 0)  | 0.626         | 0.687       | −0.687      |

In an example embodiment, a ternary logic circuit uses a turn-on/turn-off state operation of the CNTFET. A turn-on/ turn-off switching operation is based on the principle that a source-drain current of a CNTFET is determined based on a gate voltage. In a general operation, like an operation of a CMOS, when a drain voltage $V_{DD}$ is input to a gate of a p-type CNTFET, no current flows between a source and a drain such that the p-type CNTFET is turned off. If a ground voltage GND is input to the gate of the p-type CNTFET, a current flows between the source and the drain such that the p-type CNTFET is turned on. Conversely, when a drain voltage $V_{DD}$ is input to a gate of an n-type CNTFET, a current flows between a source and a drain such that the n-type CNTFET is turned on. If a ground voltage GND is input to the gate of the n-type CNTFET, no current flows between the source and the drain such that the n-type CNTFET is turned off.

Furthermore, when a half drain voltage $V_{DD}/2$, that is, 0.45 volts (V) is input to the gate of the CNTFET, the p-type CNTFET and the n-type CNTFET having a chiral vector of (17, 0) are turned on, and the p-type CNTFET and the n-type CNTFET having a chiral vector of (8, 0) are turned off.

Binary Logic Circuit

A binary logic circuit is a logic circuit that is based on two logical values. Binary logic uses logical values "0" and "1". A binary logic gate is a circuit for performing a logical operation of a binary function. The binary logic gate may represent two logical values using two voltage levels, as shown in Table 2 below.

TABLE 2

| Voltage Level | Binary logical value |
| --- | --- |
| Ground voltage (Gnd) | 0 |
| Drain voltage (VDD) | 1 |

Ternary Logic Circuit

A ternary logic circuit is a logic circuit that is based on three logical values. The ternary logic circuit includes an unbalanced ternary logic that uses logical values "0", "1", and "2" and a balanced ternary logic that uses logical values "−1", "0", and "1". A ternary logic gate is a circuit for performing a logical operation of a ternary function. The ternary logic gate may represent three logical values using three voltage levels, as shown in Table 3 below.

TABLE 3

| Voltage Level | Ternary logical value | |
| --- | --- | --- |
| | Unbalanced | Balanced |
| Ground voltage (Gnd) | 0 | −1 |
| Half drain voltage (VDD/2) | 1 | 0 |
| Drain voltage (VDD) | 2 | 1 |

Static Gate Design

A static gate may include a pull-up network and a pull-down network. Hereinafter, a network refers to a structure in which elements are physically connected. The terms "network" and "circuit" may be used in the same sense. For example, a pull-up network and a pull-down network may be a pull-up circuit and a pull-down circuit. The pull-up network and the pull-down network may include a combination of transistors, wherein the connectivity of the networks may be determined based on a switching operation of the transistors according to input voltages. The pull-up network may be connected to a drain power source that supplies a drain voltage, and include p-type transistors. Conversely, the pull-down network may be connected to a ground that supplies a ground voltage, and include n-type transistors.

Figure 2:
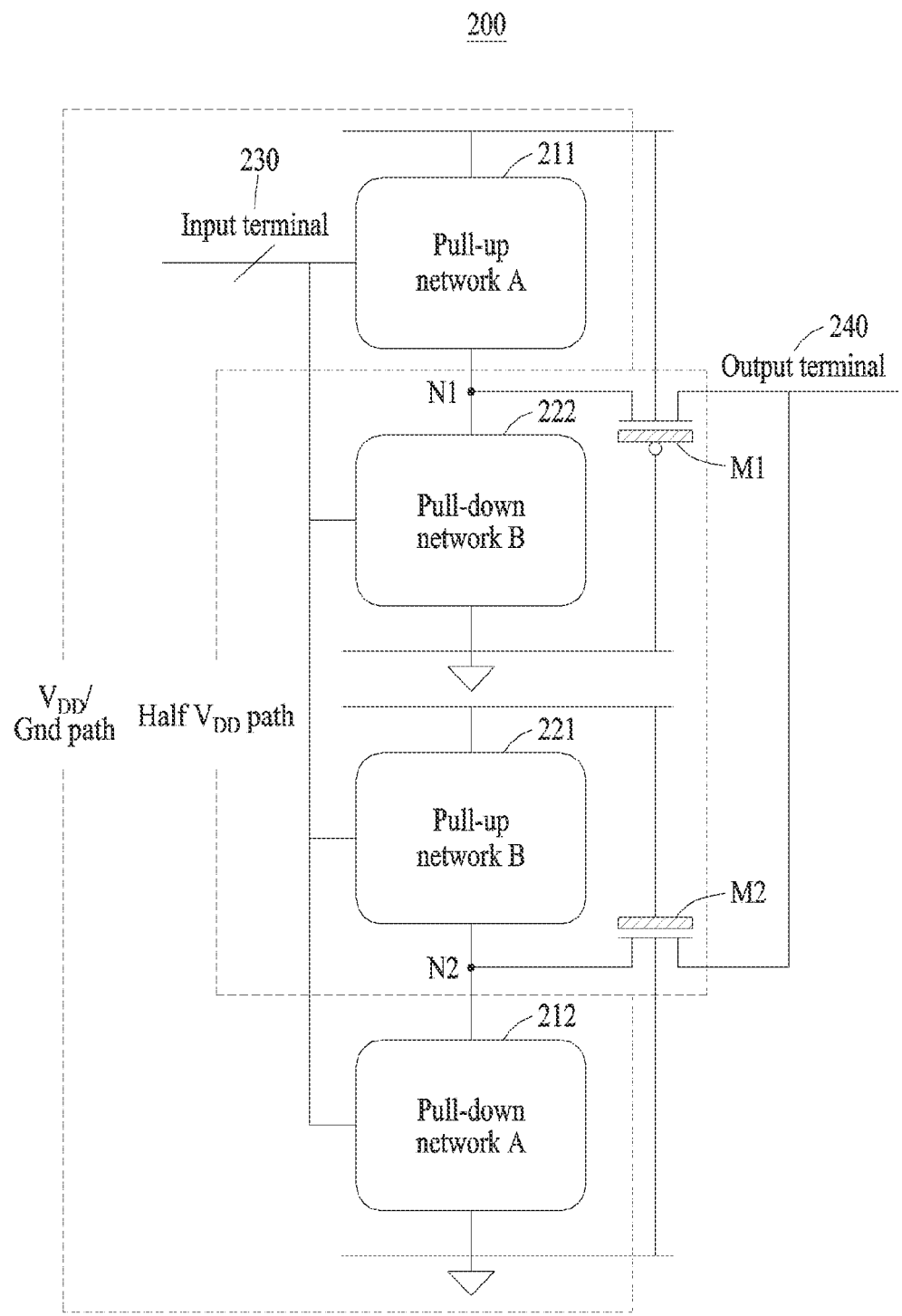
FIG. 2 illustrates a static gate for a ternary logic gate.

FIG. 2 illustrates a static gate for a ternary logic gate.

A static gate 200 for a ternary logic gate may include a first pull-up circuit 211, a first pull-down circuit 212, a second pull-up circuit 221, a second pull-down circuit 222, a first transistor M1, and a second transistor M2. Hereinafter, the first transistor M1 will be referred to as the first pass transistor M1, and the second transistor M2 will be referred to as the second pass transistor M2. The static gate 200 for a ternary logic gate may include a single-walled carbon nanotube field-effect transistor (CNTFET).

The static gate 200 may have a drain-ground ($V_{DD}$/GND) path for outputting a drain voltage through the first pass transistor M1 when the first pull-up circuit 211 is turned on and for outputting a ground voltage through the second pass transistor M2 when the first pull-down circuit 212 is turned on. Further, the static gate 200 may include a half drain path for outputting a half drain ($V_{DD}/2$) voltage through the first pass transistor M1 and the second pass transistor M2 when both the second pull-up circuit 221 and the second pull-down circuit 222 are turned on. The first pass transistor M1 may connect a node N1 between the first pull-up circuit 211 and the second pull-down circuit 222 to an output terminal 240, and the second pass transistor M2 may connect a node N2 between the second pull-up circuit 221 and the first pull-down circuit 212 to the output terminal 240.

In the static gate 200, the first pull-up circuit 211 may connect the second pull-down circuit 222, a drain power source that supplies a drain voltage, and the first pass transistor M1. The first pull-down circuit 212 may connect the second pull-up circuit 221, a ground that supplies a ground voltage, and the second pass transistor M2. The second pull-up circuit 221 may connect the first pull-down circuit 212, the drain power supply that supplies a drain voltage, and the second pass transistor M2. The second pull-down circuit 222 may connect the first pull-up circuit 211, the ground that supplies a ground voltage, and the first pass transistor M1.

In summary, a drain voltage $V_{DD}$ may be transmitted from the drain power source to the output terminal 240 when the first pull-up circuit 211 is turned on, and a ground voltage GND may be transmitted from the ground to the output terminal 240 when the first pull-down circuit 212 is turned on. The second pull-up circuit 221, the second pull-down circuit 222, the first pass transistor M1, and the second pass transistor M2 may be used to transmit a half drain voltage ($V_{DD}/2$) to the output terminal 240.

In the static gate 200, the first pull-up circuit 211 and the second pull-up circuit 221 may include doping-type transistors like the first pass transistor M1, and the first pull-down circuit 212 and the second pull-down circuit 222 may include doping-type transistors like the second pass transistor M2. Further, the first pass transistor M1 and the second pass transistor M2 may have opposite doping types. For example, the first pull-up circuit 211, the second pull-up circuit 221, and the first pass transistor M1 may be p-type transistors, and the first pull-down circuit 212, the second pull-down circuit 222, and the second pass transistor M2 may be n-type transistors. In the static gate 200, the plurality of circuits 211, 212, 221, and 222 may include two types of transistors having different threshold voltages. The static gate 200 may include a transistor having a first threshold voltage less than a half drain ($V_{DD}/2$) voltage and a transistor having a second threshold voltage greater than or equal to the half drain voltage. The two types of transistors having different threshold voltages may be used for different switching operations when a half drain ($V_{DD}/2$) is applied to an input terminal 230. When a half drain voltage is applied to the input terminal 230, the transistor having the first threshold voltage may be turned on, and the transistor having the second threshold voltage may be turned off. In addition, the first pass transistor M1 and the second pass transistor M2 in the static gate 200 may be transistors having a third threshold voltage between the first threshold voltage and the second threshold voltage. For example, the first threshold voltage may be 0.323 V, the second threshold voltage may be 0.687 V, and the third threshold voltage may be 0.428 V. However, example embodiments are not limited thereto.

The static gate 200 may output a half drain voltage ($V_{DD}/2$). When a half drain voltage is output from the output terminal 240 in response to both the second pull-up circuit 221 and the second pull-down circuit 222 in the static gate 200 being turned on, both the first pass transistor M1 and the second pass transistor M2 may be turned off to maintain the output of the half drain voltage. Specifically, when the voltage of the output terminal 240 in the static gate 200 is reduced from a drain voltage to a half drain voltage, the second pull-down circuit 222 may be turned on, the voltage of the first node N1 may be changed from a drain voltage to a ground voltage, and the first pass transistor M1 connected to the first node N1 may maintain the output voltage as a half drain voltage. In this example, when the voltage of the first node N1 is less than or equal to a threshold voltage, the first pass transistor M1 may be turned off. Further, when the voltage of the output terminal 240 in the static gate 200 is increased from a ground voltage to a half drain voltage, the second pull-up circuit 221 may be turned on, the voltage of the second node N2 may be changed from a ground voltage to a drain voltage, and the second pass transistor M2 connected to the second node N2 may maintain the output voltage as a half drain voltage. In this example, when the voltage of the second node N2 is greater than or equal to a voltage obtained by subtracting a threshold voltage from the drain voltage, the second pass transistor M2 may be turned off.

Figure 3:
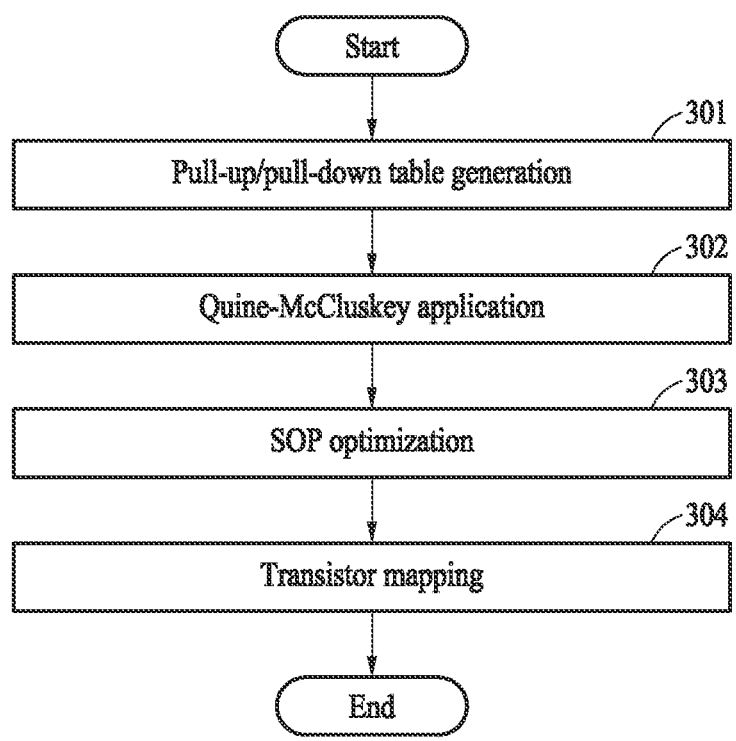
FIG. 3 is a flowchart illustrating a process of ternary logic synthesis.

FIG. 3 is a flowchart illustrating a process of ternary logic synthesis.

A ternary logic synthesis method may include pull-up/pull-down table generation operation 301, Quine-McCluskey algorithm application operation 302, sum of products (SOP) optimization operation 303, and transistor mapping operation 304.

First, in operation 301, the process of ternary logic synthesis generates pull-up and pull-down tables of a drain-ground path and pull-up and pull-down tables of a half drain ($V_{DD}/2$) path using a truth table representing a ternary function. Each pull-up/pull-down table may represent a switching operation of a corresponding network. The pull-up/pull-down tables of the half drain path include don't-care terms and thus, need to be processed differently from the pull-up/pull-down tables of the drain-ground path. All possible pull-up/pull-down tables of the half drain path are generated by inserting turn-on or turn-off into all don't-care terms.

In operation 302, the Quine-McCluskey algorithm is applied to all the pull-up/pull-down tables of the drain-ground path and the half drain path. The Quine-McCluskey algorithm converts all portions having a turn-on state in the pull-up/pull-down tables into a minterm canonical expression. The converted minterms are reduced through a repetitive merging process, such that a sum of one or more products (SOP) is generated.

Next, in operation 303, a SOP that optimizes a ternary logic circuit is selected through SOP optimization. Last, in operation 304, an appropriate transistor may be mapped using the selected SOP.

Figure 4:
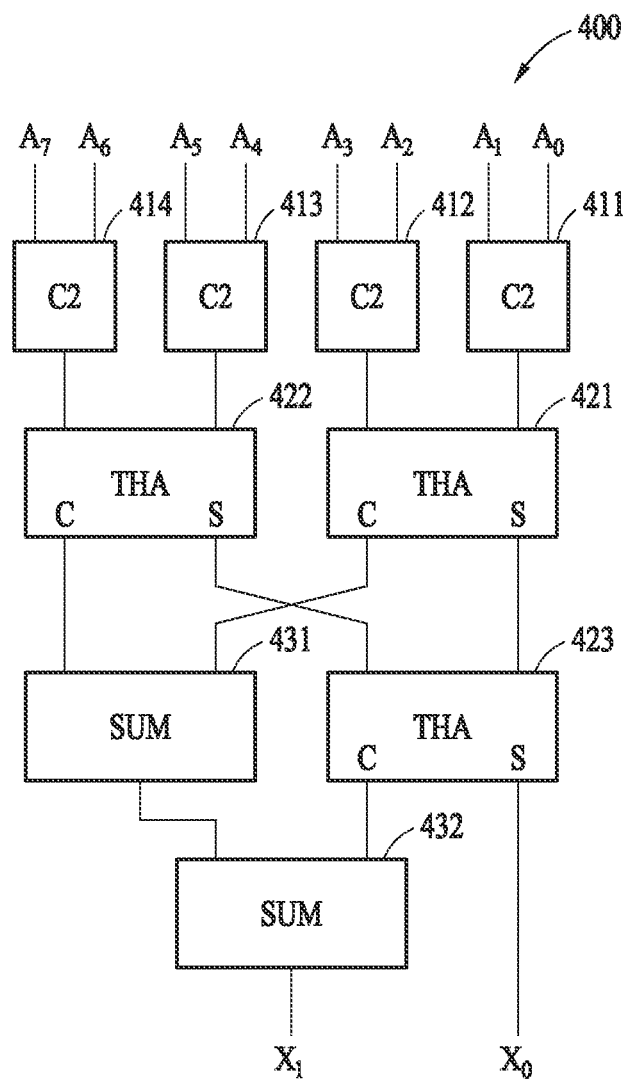
FIG. 4 illustrates a structure of a first circuit according to an example embodiment.

FIG. 4 illustrates a structure of a first circuit according to an example embodiment.

Hereinafter, a logic gate designed using a binary logic circuit and an unbalanced ternary logic of a ternary logic circuit will be described. A first circuit may receive a plurality of input signals. For example, a count circuit may receive eight, ten, or twelve input signals. Hereinafter, a first circuit 400 that receives eight input signals will be described.

The input signals applied to the first circuit 400 may be one of drain voltages $V_{DD}$, half drain voltages $V_{DD}/2$, and ground voltages GND. In an unbalanced ternary logic, a drain voltage may indicate a logical value "2", a half drain voltage may indicate a logical value "1", and a ground voltage may indicate a logical value "0". For example, the drain voltage may be 0.9 V, and the half drain voltage may be 0.45 V, and the ground voltage may be 0 V. The first circuit 400 may be a circuit capable of counting the number of drain voltages among the plurality of input signals applied thereto. Hereinafter, the structure of the first circuit 400 will be described in detail.

The first circuit 400 may include a plurality of first counting gates (also referred to as "C2 gates"). The first circuit 400 may include four first counting gates 411 to 414. The plurality of first counting gates 411 to 414 may receive the plurality of input signals applied to the first circuit 400. For example, the first counting gate 411 may receive two input signals (e.g., $A_0$ and $A_1$) among the eight input signals applied to the first circuit 400. The first counting gate 412 may receive two other input signals (e.g., $A_2$ and $A_3$). The first counting gate 413 may receive two other input signals (e.g., $A_4$ and $A_5$). The first counting gate 414 may receive the other two input signals (e.g., $A_6$ and $A_7$).

A first counting gate may receive two input signals. The first counting gate is a ternary logic gate capable of performing an operation according to Equation 2 below.

$$Y(A, B) = \begin{cases} 0: & \text{if } A \neq 2 \text{ and } B \neq 2 \\ 2: & \text{if } A = 2 \text{ and } B = 2 \\ 1: & \text{otherwise} \end{cases} \quad \text{[Equation 2]}$$

In Equation 2, A and B denote logical values corresponding to a plurality of input signals applied to the first counting gate. In Equation 2, a ground voltage may indicate a logical value "0", a half drain voltage may indicate a logical value "1", and a drain voltage may indicate a logical value "2". The first counting gate may receive two input signals. The first counting gate may output a ground voltage when both input signals applied thereto are not drain voltages, output a drain voltage when both the input signals applied thereto are drain voltages, and output a half drain voltage when only one of the two input signals applied thereto is a drain voltage. As a result, the first counting gate may output voltages corresponding to the number of drain voltages $V_{DD}$ among the input signals applied thereto. For example, the first counting gate may output a drain voltage indicating "2" when two drain voltages are applied thereto, output a half drain voltage indicating "1" when one drain voltage is applied thereto, and output a ground voltage indicating "0" when the input signals include no drain voltage.

The first circuit 400 may further include a first ternary half adder (THA) 421 and a second THA 422 that are connected to the plurality of first counting gates 411 to 414. A THA is a ternary logic gate that receives two input signals, where the ternary logic gate may output an output voltage corresponding to a sum of trit logical values indicated by the two input signals applied thereto. The first THA 421 may receive an output signal of the first counting gate 411 and an output signal of the first counting gate 412. The second THA 422 may receive an output signal of the first counting gate 413 and an output signal of the first counting gate 414. A THA may perform an operation according to a truth table described in Table 4 below. In Table 4, a ground voltage GND indicates a logical value "0", a half drain voltage $V_{DD}/2$ indicates a logical value "1", and a drain voltage $V_{DD}$ indicates a logical value "2".

TABLE 4

| $I_1$ | $I_2$ | C | S |
|---|---|---|---|
| 0 | 0 | 0 | 0 |
| 0 | 1 | 0 | 1 |
| 0 | 2 | 0 | 2 |
| 1 | 0 | 0 | 1 |
| 1 | 1 | 0 | 2 |
| 1 | 2 | 1 | 0 |
| 2 | 0 | 0 | 2 |
| 2 | 1 | 1 | 0 |
| 2 | 2 | 1 | 1 |

In Table 4 above, $I_1$ and $I_2$ denote input signals applied to the THA, S denotes a sum output signal that is output by the THA, and C denotes a carry output signal that is output by the THA.

The first circuit 400 may further include a third THA 423 that receives a sum output signal of the first THA 421 and a sum output signal of the second THA 422. The first circuit 400 may further include a first ternary sum gate 431 that receives a carry output signal of the first THA 421 and a carry output signal of the second THA 422. The first circuit 400 may further include a second ternary sum gate 432 that receives a carry output signal of the third THA 423 and an output signal of the first ternary sum gate 431. A ternary sum gate may be a gate that outputs an output signal corresponding to a remainder of the sum of logical values indicated by received input signals, divided by "3". A ternary sum gate may perform an operation according to a truth table described in Table 5 below.

TABLE 5

| $I_1$ | $I_2$ | Output |
|---|---|---|
| 0 | 0 | 0 |
| 0 | 1 | 1 |
| 0 | 2 | 2 |
| 1 | 0 | 1 |
| 1 | 1 | 2 |
| 1 | 2 | 0 |
| 2 | 0 | 2 |
| 2 | 1 | 0 |
| 2 | 2 | 1 |

The first circuit 400 may output a sum output signal $X_0$ of the third THA 423 and an output signal $X_1$ of the second ternary sum gate 432. A combination of trit logical values indicated by the output signals of the first circuit 400 is the same as a ternary expression of the number of drain voltages $V_{DD}$ among the plurality of input signals applied to the first circuit 400. For example, a ternary value $X_1 X_{0(3)}$ of a combination of the logical values indicated by the output signals of the first circuit 400 is equal to the number of drain voltages among the plurality of input signals $A_0$ to $A_7$ applied to the first circuit 400. In other words, a trit sequence in which the logical values indicated by the output signals of the first circuit 400 are combined sequentially may be a ternary expression of the number of drain voltages among the input signals $A_0$ to $A_7$.

Figure 5:
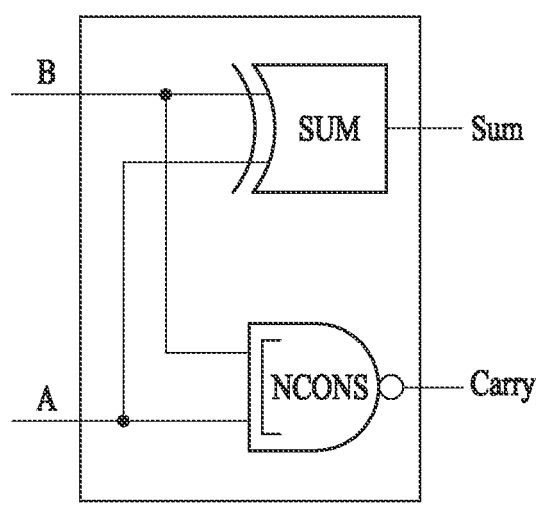
FIG. 5 illustrates a gate-level design of a ternary logic gate.

Hereinafter, a method of designing each ternary logic gate using transistors will be described. FIG. 5 illustrates a gate-level design of a ternary logic gate. In detail, FIG. 5 illustrates a gate-level design of an unbalanced THA, wherein the unbalanced THA may include a single ternary sum gate and a single NCONS gate.

Figure 6A:
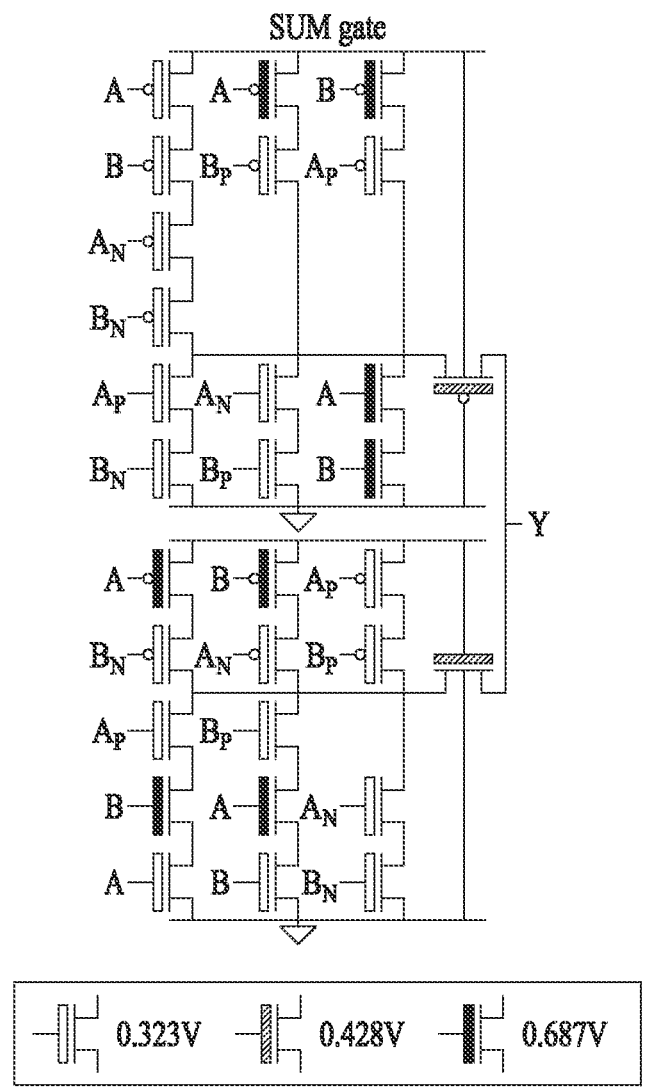
FIGS. 6A and 6B illustrate transistor-level designs of ternary logic gates in an unbalanced ternary logic.
Figure 6B:
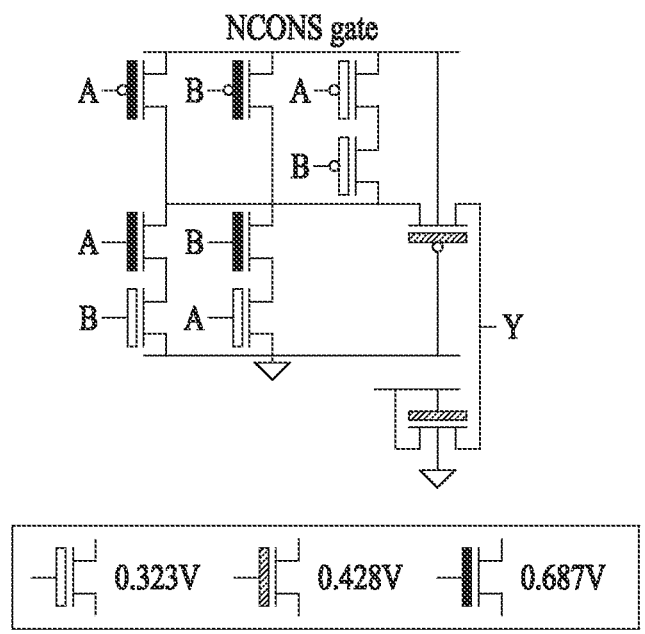

FIGS. 6A and 6B illustrate transistor-level designs of ternary logic gates in an unbalanced ternary logic. In detail, FIG. 6A illustrates a transistor-level design of a ternary sum gate, and FIG. 6B illustrates a transistor-level design of an NCONS gate in an unbalanced ternary logic. For reference, an NCONS may perform an operation according to a truth table described in Table 6 below.

TABLE 6

| $I_1$ | $I_2$ | NCONS |
|---|---|---|
| 0 | 0 | 2 |
| 0 | 1 | 2 |
| 0 | 2 | 2 |
| 1 | 0 | 2 |
| 1 | 1 | 2 |
| 1 | 2 | 0 |
| 2 | 0 | 2 |
| 2 | 1 | 1 |
| 2 | 2 | 1 |

Hereinafter, a method of designing a ternary sum gate among ternary logic gates at a transistor level will be described as an example. Table 7 is a pull-up/pull-down table generated from a truth table for a ternary sum gate in an unbalanced ternary logic.

TABLE 7

| $I_1$ | $I_2$ | VDD/Gnd Up | VDD/Gnd Down | Half-VDD Up | Half-VDD Down |
|---|---|---|---|---|---|
| 0 | 0 | OFF | ON | OFF | X |
| 0 | 1 | OFF | OFF | ON | ON |
| 0 | 2 | ON | OFF | X | OFF |
| 1 | 0 | OFF | OFF | ON | ON |
| 1 | 1 | ON | OFF | X | OFF |
| 1 | 2 | OFF | ON | OFF | X |
| 2 | 0 | ON | OFF | X | OFF |
| 2 | 1 | OFF | ON | OFF | X |
| 2 | 2 | OFF | OFF | ON | ON |

Minimization for designing a ternary logic circuit with a minimum number of transistors may be performed using the generated pull-up/pull-down table. However, before the minimization, don't-care terms (portions marked with X) present in the pull-up/pull-down table of a half drain path need to be processed. Each don't-care term may be replaced with on or off. To synthesize a circuit to the optimum for an arbitrary truth table, all combinations in which don't-care terms are substituted for on or off should be considered. Accordingly, all possible pull-up/pull-down tables in which a pull-up/pull-down table of a half drain path includes only on or off are generated. The pull-up/pull-down tables may be all optimized through a proposed minimization algorithm, and accordingly, a single pull-up/pull-down table with the minimum number of transistors may be selected. The following Table 8 shows a pull-up/pull-down table in which don't-care terms are processed to have a minimum number of transistors for a two-input ternary sum gate.

TABLE 8

| $I_1$ | $I_2$ | VDD/Gnd Up | VDD/Gnd Down | Half-VDD Up | Half-VDD Down |
|---|---|---|---|---|---|
| 0 | 0 | OFF | ON | OFF | ON |
| 0 | 1 | OFF | OFF | ON | ON |
| 0 | 2 | ON | OFF | ON | OFF |
| 1 | 0 | OFF | OFF | ON | ON |
| 1 | 1 | ON | OFF | OFF | OFF |
| 1 | 2 | OFF | ON | OFF | OFF |
| 2 | 0 | ON | OFF | ON | OFF |
| 2 | 1 | OFF | ON | OFF | OFF |
| 2 | 2 | OFF | OFF | ON | ON |

Next, minimization may be performed using the Quine-McCluskey algorithm. When the pull-up/pull-down table in Table 8 is provided as an input of the algorithm, the minimization process is performed, such that SOPs for pull-up/pull-down networks of a drain-ground path are $A_0B_2+A_1B_1+A_2B_0$ and $A_0B_0+A_1B_2+A_2B_1$, and SOPs for pull-up/pull-down networks of a half drain path are $A_0(B_1+B_2)+A_2B_2+(A_1+A_2)B_0$ and $A_2B_2+A_0(B_0+B_1)+(A_0+A_1)B_0$.

The SOP optimization operation is an operation of selecting an optimal SOP when a plurality of minimization SOPs are generated by the Quine-McCluskey algorithm. In the SOP optimization operation, an optimal SOP is determined in consideration of two factors. First, it is to minimize the number of transistors in a network. Second, it is to minimize the transmission delay of a network. A logic gate may be configured to reduce a transmission delay by minimizing the number of CNTFETs having a chiral vector (8, 0). For example, it is assumed that a predetermined SOP is an optimal SOP (OSOP). To verify whether the predetermined SOP is an optimal SOP, all the other SOPs except for the predetermined SOP are compared to the OSOP. For each SOP, the number of transistors required to construct a network is calculated. The number of transistors calculated for each SOP is compared to the number of transistors of the OSOP. Based on the comparison result, an SOP requiring the fewest transistors is determined to be the OSOP. If the number of transistors of a current OSOP is less than the number of transistors required for an SOP compared to the current OSOP, the current OSOP is maintained as the OSOP. By selecting an SOP requiring fewer transistors as an OSOP, it is possible to reduce the power consumption and required area of the circuit and maximize the speed thereof.

Next, when the number of required transistors is the same, the number of CNTFETs having a chiral vector (8, 0) may be reduced to alleviate the transmission delay of the circuit. In constructing a network, two types of CNTFETs having chiral vectors of (8, 0) and (17, 0) may be used. A CNTFET having a chiral vector of (13, 0) may be used to construct a first pass transistor and a second pass transistor. A chiral vector is inversely proportional to a threshold voltage of the CNTFET. Thus, a threshold voltage of a CNTFET having a chiral vector of (8, 0) is greater than a threshold voltage of a CNTFET having a chiral vector of (17, 0). Therefore, a drain current of the CNTFET having a chiral vector of (8, 0) flows less. Consequently, since the transmission delay of the logic gate increases as the drain current decreases, the transmission delay may be alleviated by reducing the number of CNTFETs having a chiral vector of (8, 0) in the case of constructing a network with the same number of transistors.

The transistor mapping operation is an operation of constructing a network by connecting appropriate devices based on a static gate design after the SOP optimization operation. For each product term of an SOP, a drain node of a predetermined transistor and a source node of a subsequent transistor are connected to connect the two transistors in series. Similarly, the SOP may be configured by connecting generated product models in parallel. In a pull-up network, transistors may be connected in parallel by connecting source nodes of the top transistor of the product models and connecting drain nodes of the bottom transistors. The logic gate may be synthesized by appropriately connecting the nodes of the networks, as shown in FIG. 2. In the manner described above, each ternary logic gate may be designed using transistors.

Figure 7:
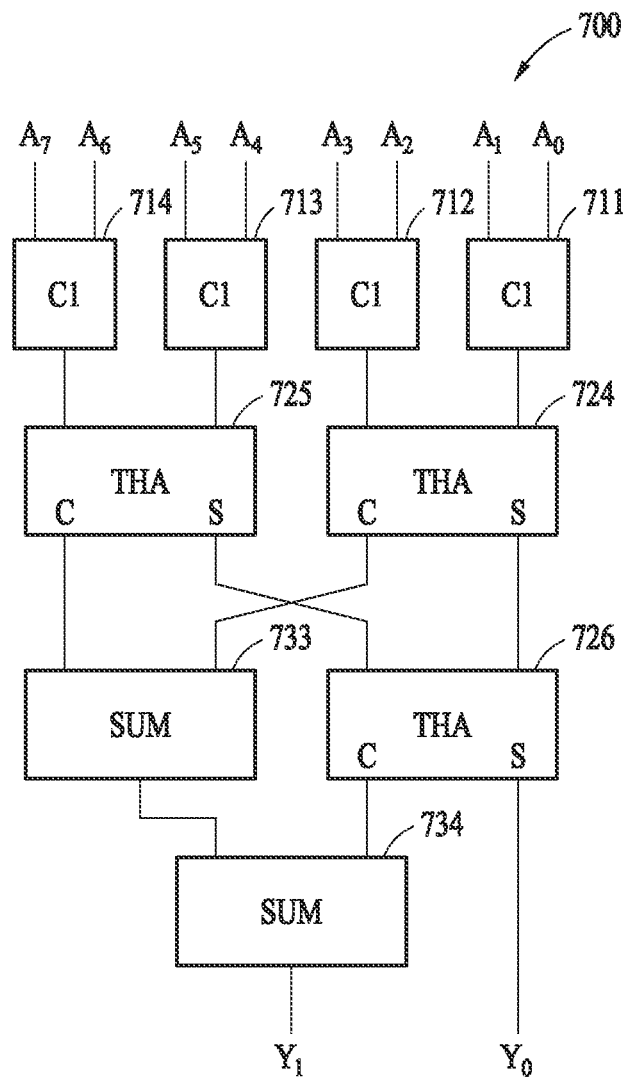
FIG. 7 illustrates a structure of a second circuit according to an example embodiment.

FIG. 7 illustrates a structure of a second circuit according to an example embodiment.

A second circuit 700 is similar to the first circuit 400 of FIG. 4. The second circuit 700 may have a structure in which the first counting gates 411 to 414 of the first circuit 400 are replaced with second counting gates 711 to 714. The second circuit 700 may be a circuit capable of counting the number of half drain voltages indicating a logical value "1" among a plurality of input signals applied thereto. Hereinafter, the structure of the second circuit 700 will be described in detail.

The second circuit 700 may include a plurality of second counting gates (also referred to as "C1 gates"). The second circuit 700 may include four second counting gates 711 to 714. The plurality of second counting gates 711 to 714 may receive the plurality of input signals applied to the second circuit 700. The second counting gate 711 may receive two input signals (e.g., $A_0$ and $A_1$) among the eight input signals applied to the second circuit 700. The second counting gate 712 may receive two other input signals (e.g., $A_2$ and $A_3$). The second counting gate 713 may receive two other input signals (e.g., $A_4$ and $A_5$). The second counting gate 714 may receive the other two input signals (e.g., $A_6$ and A). A second counting gate may receive two input signals. The second counting gate is a ternary logic gate capable of performing an operation according to Equation 3 below.

$$Y(A, B) = \begin{cases} 0: & \text{if } A \neq 1 \text{ and } B \neq 1 \\ 2: & \text{if } A = 1 \text{ and } B = 1 \\ 1: & \text{otherwise} \end{cases} \quad \text{[Equation 3]}$$

In Equation 3, A and B denote logical values corresponding to a plurality of input signals applied to the second counting gate. The second counting gate may output a ground voltage when both input signals applied thereto are not half drain voltages, output a drain voltage when both the input signals applied thereto are half drain voltages, and output a half drain voltage when only one of the two input signals applied thereto is a half drain voltage. The second counting gate may output voltages corresponding to the number of half drain voltages $V_{DD}/2$ among the input signals applied thereto. For example, the second counting gate may output a drain voltage indicating "2" when two half drain voltages are applied thereto, output a half drain voltage indicating "1" when one half drain voltage is applied thereto, and output a ground voltage indicating "0" when the input signals include no half drain voltage.

The second circuit 700 has a structure similar to that of the first circuit 400 and may include a fourth THA 724 and a fifth THA 725 that are connected to the plurality of second counting gates 711 to 714. The second circuit 700 may further include a sixth THA 726 that receives a sum output signal of the fourth THA 724 and a sum output signal of the fifth THA 725. The second circuit 700 may further include a third ternary sum gate 733 that receives a carry output signal of the fourth THA 724 and a carry output signal of the fifth THA 725. The second circuit 700 may further include a fourth ternary sum gate 734 that receives a carry output signal of the sixth THA 726 and an output signal of the third ternary sum gate 733.

The second circuit 700 may output a sum output signal $Y_0$ of the sixth THA 726 and an output signal $Y_1$ of the fourth ternary sum gate 734. A combination of trit logical values indicated by the output signals of the second circuit 700 is the same as a ternary expression of the number of half drain voltages $V_{DD}/2$ among the plurality of input signals applied to the second circuit 700. For example, a ternary value $Y_1Y_{0(3)}$ of a combination of the logical values indicated by the output signals of the second circuit 700 is equal to the number of half drain voltages among the plurality of input signals $A_0$ to $A_7$ applied to the second circuit 700.

Figure 8:
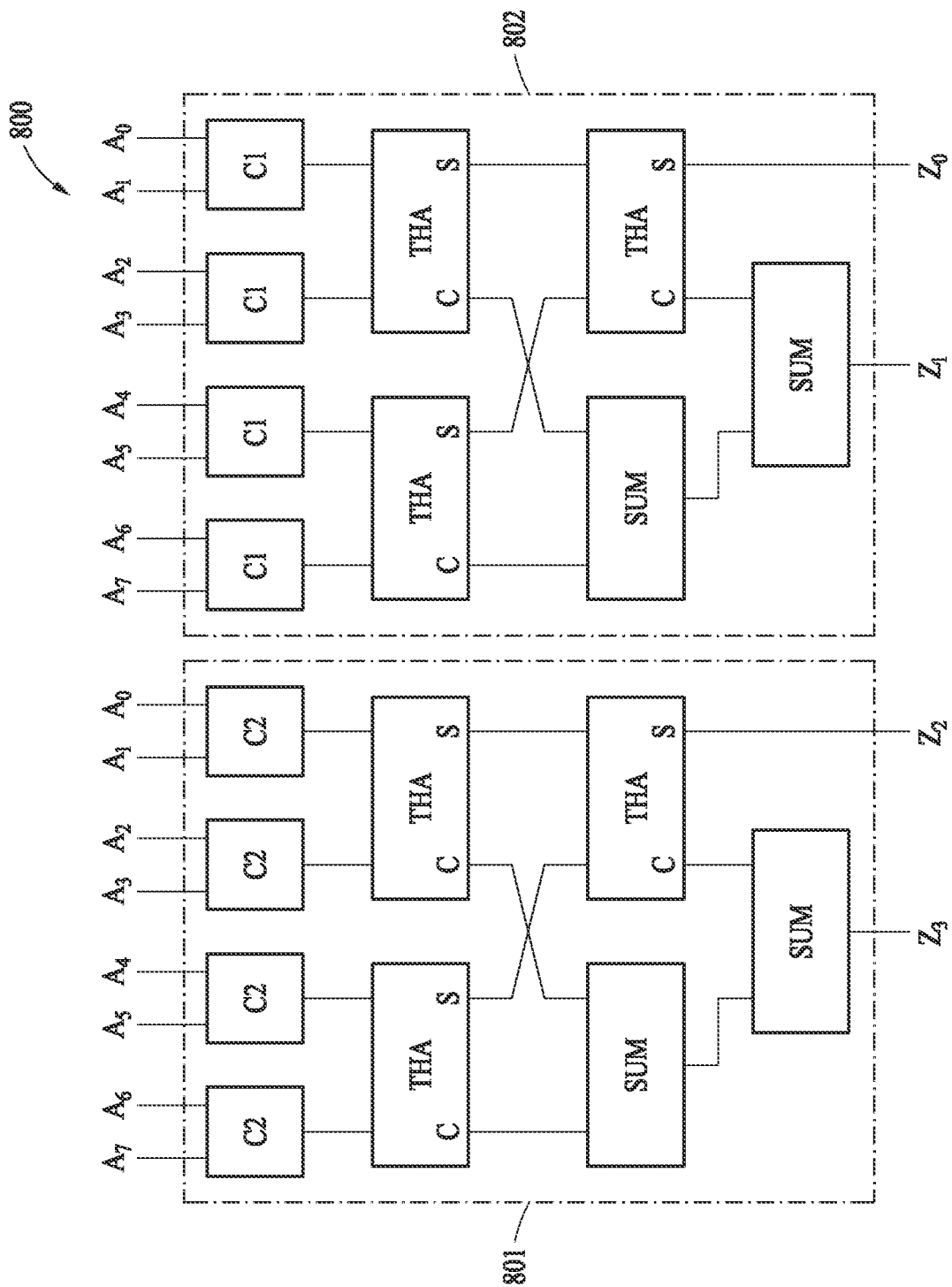
FIG. 8 illustrates a ternary count circuit according to an example embodiment.

FIG. 8 illustrates a ternary count circuit according to an example embodiment.

A ternary count circuit may perform an operation of counting the number of drain voltages and the number of half drain voltages among a plurality of input signals applied thereto. The ternary count circuit may calculate each of the number of drain voltages and the number of half drain voltages among the plurality of input signals applied thereto, thereby outputting a voltage corresponding to the calculated number. The following Equation 4 is a function expression implemented by the ternary count circuit.

$$counter_i = 3^{\lceil \log_3 i \rceil} \sum_{m=0}^{i-1} \left\lfloor \frac{x_m}{2} \right\rfloor + \sum_{m=0}^{i-1} \lfloor x_m \bmod 2 \rfloor (\text{base } 3) \qquad [\text{Equation 4}]$$

In Equation 4, i denotes the number of input signals received by the ternary count circuit. According to Equation 4, $counter_i$ is expressed by a combination of a ternary expression for the number of drain voltages among the plurality of input signals applied and a ternary expression for the number of half drain voltages among the input signals applied. Hereinafter, a ternary count circuit 800 to which eight input signals are applied will be described.

The ternary count circuit 800 may include a first circuit 801 and a second circuit 802. The first circuit 801 has the same structure as the first circuit 400 of FIG. 4, and the second circuit 802 has the same structure as the second circuit 700 of FIG. 7. The ternary count circuit 800 may receive a plurality of input signals $A_0$ to $A_7$ through the first circuit 801 and receive the plurality of input signals $A_0$ to $A_7$ through the second circuit 802. The ternary count circuit 800 outputs an output signal of the first circuit 801 and an output signal of the second circuit 802.

As described with reference to FIGS. 4 and 7, a ternary value (e.g., $Z_3Z_{2(3)}$) of a combination of logical values indicated by the output signal of the first circuit 801 is equal to the number of drain voltages among the plurality of input signals $A_0$ to $A_7$ applied to the ternary count circuit 800. Further, a ternary value (e.g., $Z_1Z_{0(3)}$) of a combination of logical values indicated by the output signal of the second circuit 802 is equal to the number of half drain voltages among the plurality of input signals $A_0$ to $A_7$ applied to the ternary count circuit 800. Consequently, by combining logical values indicated by all the output signals of the ternary count circuit 800, the number of drain voltages and the number of half drain voltages among the plurality of input signals applied to the ternary count circuit 800 may be expressed. In other words, a ternary value $Z_3Z_2Z_1Z_{0(3)}$ of a combination of the logical values indicated by the output signals of the ternary count circuit 800 is equal to a value obtained by combining a ternary expression $Z_3Z_{2(3)}$ for the number of drain voltages among the plurality of input signals applied to the ternary count circuit 800 and a ternary expression $Z_1Z_{0(3)}$ for the number of half drain voltages among the plurality of input signals applied.

Figure 9:
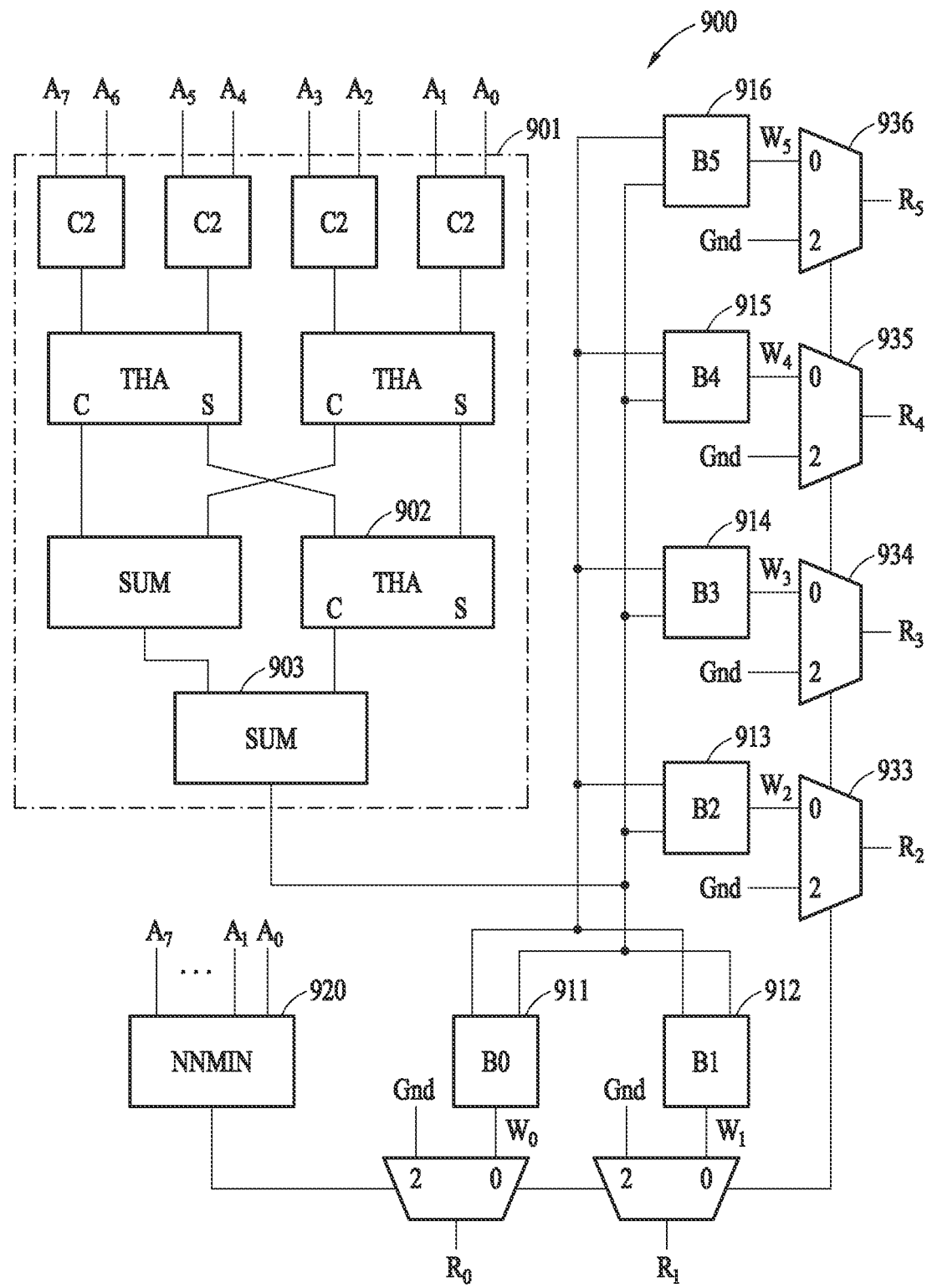
FIG. 9 illustrates a ternary multiplier circuit according to an example embodiment.

FIG. 9 illustrates a ternary multiplier circuit according to an example embodiment.

A ternary multiplier circuit may be designed using the structure of the first circuit 400 of FIG. 4. The ternary multiplier circuit may perform an operation of obtaining a value of multiplication of ternary logical values indicated by input signals. The ternary multiplier circuit may calculate the value of multiplication of the logical values indicated by the plurality of input signals and output a voltage corresponding to the calculated value of multiplication. The following Equation 5 shows a function expression implemented by the ternary multiplier circuit.

$$prod_i = \prod_{m=0}^{i-1} x_m (\text{base } 3) \qquad [\text{Equation 5}]$$

In Equation 5, i denotes the number of input signals received by the ternary multiplier circuit. In Equation 5, $prod_i$ may be a ternary expression for the value of multiplication of the logical values indicated by the input signals applied to the ternary multiplier circuit. Hereinafter, a ternary multiplier circuit 900 to which eight input signals are applied will be described.

The ternary multiplier circuit 900 may include a first circuit 901. The first circuit 901 has the same structure as the first circuit 400 of FIG. 4. The first circuit 901 in the ternary multiplier circuit 900 may count the number of drain voltages $V_{DD}$ among the plurality of input signals applied to the ternary multiplier circuit 900. In detail, the first circuit 901 may output a sum output signal of a third THA 902 and an output signal of a second ternary sum gate 903. As described with reference to FIG. 4, a combination of logical values indicated by the sum output signal of the third THA 902 and the output signal of the second ternary sum gate 903 is the same as a ternary expression of the number of drain voltages among the plurality of input signals $A_0$ to $A_7$ applied to the first circuit 901.

The ternary multiplier circuit 900 may further include a plurality of multiplication gates that receive an output signal of the first circuit 901. More specifically, the ternary multiplier circuit 900 may further include a first multiplication gate 911 (also referred to as "B0 gate"), a second multiplication gate 912 (also referred to as "B1 gate"), a third multiplication gate 913 (also referred to as "B2 gate"), a fourth multiplication gate 914 (also referred to as "B3 gate"), a fifth multiplication gate 915 (also referred to as "B4 gate"), and a sixth multiplication gate 916 (also referred to as "B5 gate"), where the first multiplication gate 911, the second multiplication gate 912, the third multiplication gate 913, the fourth multiplication gate 914, the fifth multiplication gate 915, and the sixth multiplication gate 916 may receive the sum output signal of the third THA 902 and the output signal of the second ternary sum gate 903. The multiplication gates may perform operations according to a truth table described in Table 9 below.

TABLE 9

| $I_1$ | $I_2$ | $W_5$ | $W_4$ | $W_3$ | $W_2$ | $W_1$ | $W_0$ |
|---|---|---|---|---|---|---|---|
| 0 | 0 | 0 | 0 | 0 | 0 | 0 | 1 |
| 0 | 1 | 0 | 0 | 0 | 0 | 0 | 2 |
| 0 | 2 | 0 | 0 | 0 | 0 | 1 | 1 |
| 1 | 0 | 0 | 0 | 0 | 0 | 2 | 2 |
| 1 | 1 | 0 | 0 | 0 | 1 | 2 | 1 |
| 1 | 2 | 0 | 0 | 1 | 0 | 1 | 2 |
| 2 | 0 | 0 | 0 | 2 | 1 | 0 | 1 |
| 2 | 1 | 0 | 1 | 1 | 2 | 0 | 2 |
| 2 | 2 | 1 | 0 | 0 | 1 | 1 | 1 |

In Table 9 above, $I_1$ and $I_2$ denote logical values corresponding to input signals applied to the multiplication gates. $W_0$ denotes a logical value corresponding to an output signal of the first multiplication gate. $W_1$ denotes a logical value corresponding to an output signal of the second multiplication gate. $W_2$ denotes a logical value corresponding to an output signal of the third multiplication gate. $W_3$ denotes a logical value corresponding to an output signal of the fourth multiplication gate. $W_4$ denotes a logical value corresponding to an output signal of the fifth multiplication gate. $W_5$ denotes a logical value corresponding to an output signal of the sixth multiplication gate.

Hereinafter, the logical values output from the multiplication gates will be described. The first multiplication gate, the second multiplication gate, the third multiplication gate, the fourth multiplication gate, the fifth multiplication gate, and the sixth multiplication gate may receive two inputs (a first input and a second input). In response to both the logical value of the first input and the logical value of the second input being "0", the first multiplication gate may output a logical value "1", and the second multiplication gate, the third multiplication gate, the fourth multiplication gate, the fifth multiplication gate, and the sixth multiplication gate may output a logical value "0". In response to the logical value of the first input being "0" and the logical value of the second input being "1", the first multiplication gate may output a logical value "2", and the second multiplication gate, the third multiplication gate, the fourth multiplication gate, the fifth multiplication gate, and the sixth multiplication gate may output a logical value "0". In response to the logical value of the first input being "0" and the logical value of the second input being "2", the first multiplication gate may output a logical value "1", the second multiplication gate may output a logical value "2", and the third multiplication gate, the fourth multiplication gate, the fifth multiplication gate, and the sixth multiplication gate may output a logical value "0". In response to the logical value of the first input being "1" and the logical value of the second input being "0", the first multiplication gate and the second multiplication gate may output a logical value "2", and the third multiplication gate, the fourth multiplication gate, the fifth multiplication gate, and the sixth multiplication gate may output a logical value "0". In response to the logical value of the first input being "1" and the logical value of the second input being "1", the first multiplication gate and the third multiplication gate may output a logical value "1", and the second multiplication gate, the fourth multiplication gate, the fifth multiplication gate, and the sixth multiplication gate may output a logical value "0". In response to the logical value of the first input being "1" and the logical value of the second input being "2", the second multiplication gate and the fourth multiplication gate may output a logical value "1", the first multiplication gate may output a logical value "2", and the third multiplication gate, the fifth multiplication gate, and the sixth multiplication gate may output a logical value "0". In response to the logical value of the first input being "2" and the logical value of the second input being "0", the first multiplication gate and the third multiplication gate may output a logical value "1", the fourth multiplication gate may output a logical value "2", and the second multiplication gate, the fifth multiplication gate, and the sixth multiplication gate may output a logical value "0". In response to the logical value of the first input being "2" and the logical value of the second input being "1", the fourth multiplication gate and the fifth multiplication gate may output a logical value "1", the first multiplication gate and the third multiplication gate may output a logical value "2", and the second multiplication gate and the sixth multiplication gate may output a logical value "0". In response to the logical value of the first input being "2" and the logical value of the second input being "2", the first multiplication gate, the second multiplication gate, the third multiplication gate, and the sixth multiplication gate may output a logical value "1", and the fourth multiplication gate and the fifth multiplication gate may output a logical value "0".

The ternary multiplier circuit 900 may only need to count the number of drain voltages $V_{DD}$ indicating a logical value "2" to calculate a product of the logical values indicated by the input signals applied thereto. That is because a half drain voltage $V_{DD}/2$ indicates a logical value "1" and thus, has no effect on the product of logical values. Although it will be described later, the product of logical values is "0" when the plurality of input signals applied to the ternary multiplier circuit 900 include at least one ground voltage indicating "0". Thus, the ternary multiplier circuit 900 may output a ground voltage as an output signal using an NNMIN gate 920.

The first circuit 901 outputs an output voltage corresponding to the number of drain voltages indicating a logical value "2" among the input signals. The multiplication gates 911 to 916 may receive the output voltage of the first circuit 901 and output an output voltage corresponding to the product of the logical values indicated by the input signals. More specifically, a combination of logical values indicated by the signals output from the multiplication gates 911 to 916 is the same as a ternary expression of the product of logical values indicated by the input signals applied to the ternary multiplier circuit 900. For example, a ternary value $W_5W_4W_3W_2W_1W_0$ of a combination of the logical values indicated by the signals output from the multiplication gates 911 to 916 is the same as the product of the logical values indicated by the plurality of input signals $A_0$ to $A_7$ applied to the ternary multiplier circuit 900. In other words, a trit sequence in which the logical values indicated by the output signals of the ternary multiplier circuit 900 are combined sequentially may be a ternary expression of the product of the logical values indicated by the plurality of input signals $A_0$ to $A_7$.

The ternary multiplier circuit 900 may further include the NNMIN gate 920. The NNMIN gate 920 may receive the plurality of input signals (e.g., $A_0$ to $A_7$). The NNMIN gate may output a ground voltage when a minimum voltage among the plurality of input signals A0 to A7 applied thereto is a ground voltage GND, and output a drain voltage when the minimum voltage among the plurality of input signals applied thereto is one of a half drain voltage and a drain voltage. In detail, the NNMIN gate is a ternary logic gate capable of performing an operation according to Equation 6 below.

$$Y(A_0, A_1, \ldots, A_m) = \begin{cases} 0 & \text{if } \min(A_0, A_1, \ldots, A_m) = 0 \\ 2 & \text{if } \min(A_0, A_1, \ldots, A_m) = 1 \\ 2 & \text{if } \min(A_0, A_1, \ldots, A_m) = 2 \end{cases} \quad \text{[Equation 6]}$$

In other words, the NNMIN gate 920 may output a ground voltage indicating a logical value "0" when at least one of the plurality of input signals applied thereto is a ground voltage. The NNMIN gate 920 may output a drain voltage indicating a logical value "2" when all the plurality of input signals applied thereto are not ground voltages.

The ternary multiplier circuit 900 may further include a first multiplexer 931 that selectively outputs one of a ground voltage GND and an output signal of the first multiplication gate 911 received as input signals, based on an output signal of the NNMIN gate 920 received as a selected signal. The ternary multiplier circuit 900 may further include a second multiplexer 932 that selectively outputs one of a ground voltage and an output signal of the second multiplication gate 912 received as input signals, based on the output signal of the NNMIN gate 920 received as the selected signal. The ternary multiplier circuit 900 may further include a third multiplexer 933 that selectively outputs one of a ground voltage and an output signal of the third multiplication gate 913 received as input signals, based on the output signal of the NNMIN gate 920 received as the selected signal. The ternary multiplier circuit 900 may further include a fourth multiplexer 934 that selectively outputs one of a ground voltage and an output signal of the fourth multiplication gate 914 received as input signals, based on the output signal of the NNMIN gate 920 received as the selected signal. The ternary multiplier circuit 900 may further include a fifth multiplexer 935 that selectively outputs one of a ground voltage and an output signal of the fifth multiplication gate 915 received as input signals, based on the output signal of the NNMIN gate 920 received as the selected signal. The ternary multiplier circuit 900 may further include a sixth multiplexer 936 that selectively outputs one of a ground voltage and an output signal of the sixth multiplication gate 916 received as input signals, based on the output signal of the NNMIN gate 920 received as the selected signal.

The multiplexers 931 to 936 may output a ground voltage GND as the output signal of the ternary multiplier circuit 900 when a ground voltage indicating a logical value "0" is received as the selected signal. That is, when the multiplexers 931 to 936 receive a ground voltage indicating a logical value "0" as the selected signal, it indicates that at least one of the plurality of input signals $A_0$ to $A_7$ applied to the ternary multiplier circuit 900 is a ground voltage. The multiplexers 931 to 936 may receive aground voltage as the selected signal and output a ground voltage GND as the output signal. A ternary value $R_5R_4R_3R_2R_1R_{0(3)}$ of a combination of the logical values indicated by the output signals of the ternary multiplier circuit 900 is "0" and is the same as "0" which is the product of the logical values indicated by the input signals $A_0$ to $A_7$ applied to the ternary multiplier circuit 900 since at least one of the input signals indicates "0".

The multiplexers 931 to 936 may output the output signals of the multiplication gates 911 to 916 respectively connected to the multiplexers as the output signals of the ternary multiplier circuit 900 when a drain voltage indicating a logical value "2" is received as the selected signal. That is, when all of the plurality of input signals applied to the ternary multiplier circuit 900 are not ground voltages, the NNMIN gate 920 outputs a drain voltage indicating a logical value "2". The multiplexers 931 to 936 receive the drain voltage as the selected signal and output the output signals of the multiplication gates 911 to 916 as the output signals of the ternary multiplier circuit 900. A ternary value $R_5R_4R_3R_2R_1R_{0(3)}$ of a combination of the logical values indicated by the output signals of the ternary multiplier circuit 900 is the same as a ternary value $W_5W_4W_3W_2W_1W_{0(3)}$ of a combination of the logical values indicated by the output signals of the multiplication gates 911 to 916. Consequently, a combination $R_5R_4R_3R_2R_1R_{0(3)}$ of the logical values indicated by the output signals of the ternary multiplier circuit 900 is the same as a ternary expression of the product of the logical values indicated by the plurality of input signals applied to the ternary multiplier circuit 900.

The first counting gate, the second counting gate, the NNMIN gate, the first multiplication gate, the second multiplication gate, the third multiplication gate, the fourth multiplication gate, the fifth multiplication gate, and the sixth multiplication gate, used for designing the ternary count circuit 800 and the ternary multiplier circuit 900, may be designed at a transistor level through the pull-up/pull-down table generation, Quine-McCluskey algorithm application, SOP optimization, and transistor mapping operations proposed above.

Figure 10A:
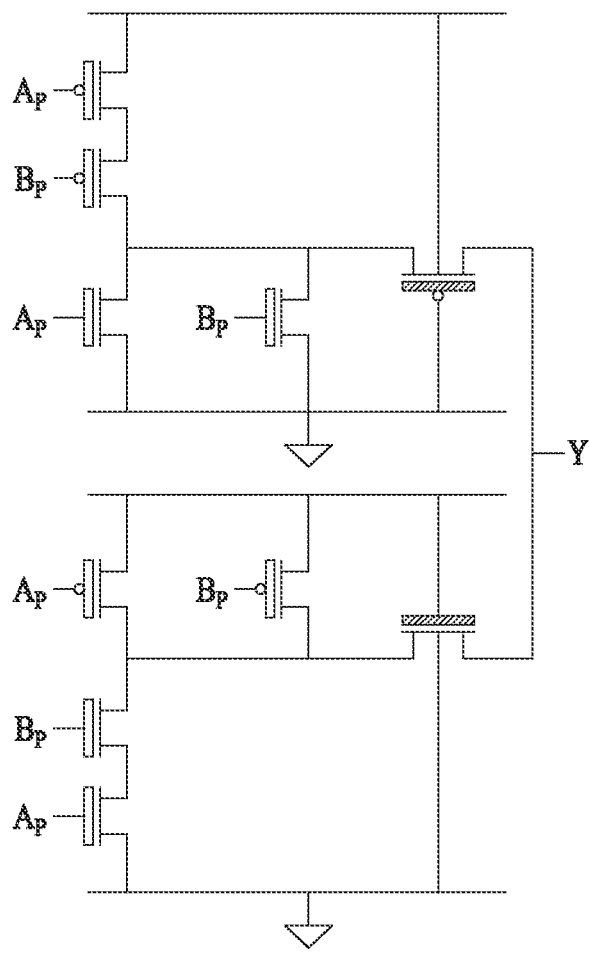
FIGS. 10A and 10B illustrate counting gates designed at a transistor level.
Figure 10B:
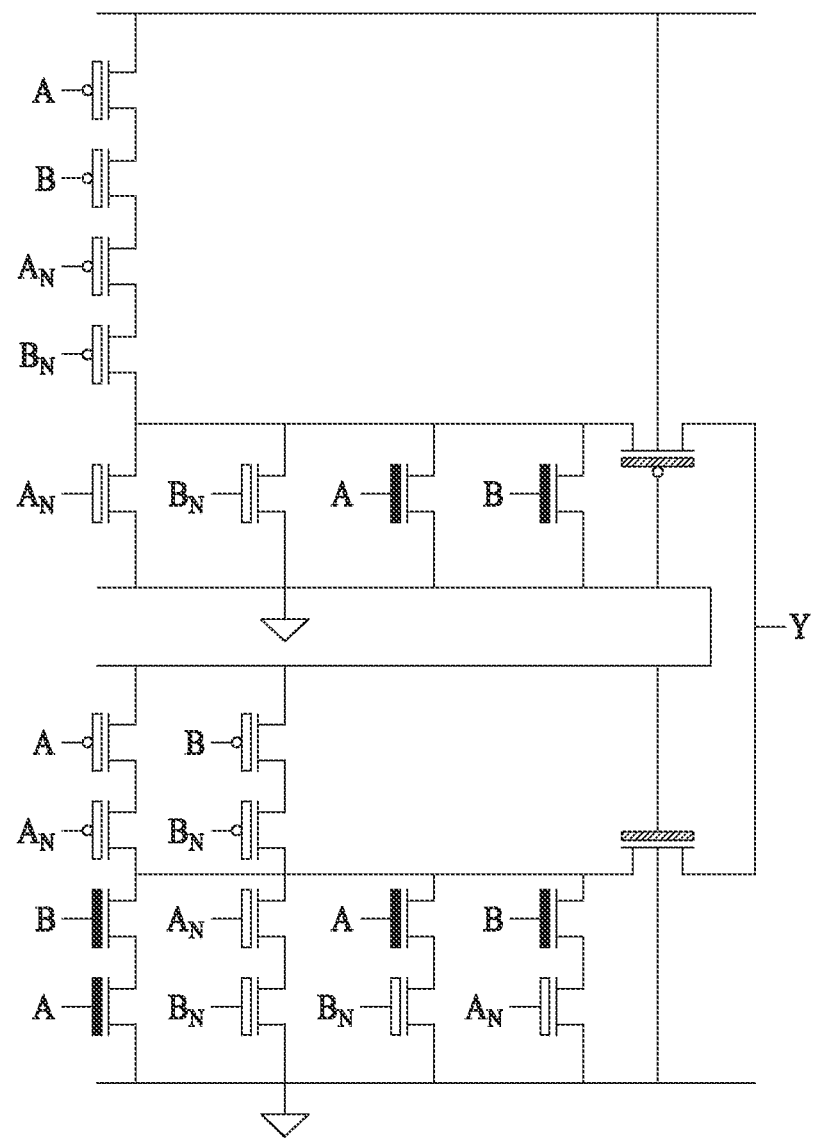

FIGS. 10A and 10B illustrate counting gates designed at a transistor level.

FIG. 10A illustrates a first counting gate designed at a transistor level. Table 10 is a pull-up/pull-down table generated from a truth table for the first counting gate.

TABLE 10

| I | $I_2$ | VDD/Gnd Up | VDD/Gnd Down | Half-VDD Up | Half-VDD Down |
|---|---|---|---|---|---|
| 0 | 0 | 0 | 1 | 0 | X |
| 0 | 1 | 0 | 1 | 0 | X |
| 0 | 2 | 0 | 0 | 1 | 1 |
| 1 | 0 | 0 | 1 | 0 | X |
| 1 | 1 | 0 | 1 | 0 | X |
| 1 | 2 | 0 | 0 | 1 | 1 |
| 2 | 0 | 0 | 0 | 1 | 1 |
| 2 | 1 | 0 | 0 | 1 | 1 |
| 2 | 2 | 1 | 0 | X | 0 |

Next, minimization may be performed using the Quine-McCluskey algorithm. When the pull-up/pull-down table in Table 10 is provided as an input of the algorithm, the minimization process is performed, such that SOPs for pull-up/pull-down networks of a drain-ground path are $A_2B_2$ and $(A_0+A_1)*(B_0+B_1)$, and SOPs for pull-up/pull-down networks of a half drain path are $A_2+B_2$ and $A_0+A_1+B_0+B_1$. Next, through the SOP optimization and transistor mapping operations, the first counting gate may be designed at a transistor level.

FIG. 10B illustrates a second counting gate designed at a transistor level. Table 11 is a pull-up/pull-down table generated from a truth table for the second counting gate.

TABLE 11

| $I_1$ | $I_2$ | VDD/Gnd Up | VDD/Gnd Down | Half-VDD Up | Half-VDD Down |
|---|---|---|---|---|---|
| 0 | 0 | 0 | 1 | 0 | X |
| 0 | 1 | 0 | 0 | 1 | 1 |
| 0 | 2 | 0 | 1 | 0 | X |

TABLE 11-continued

| $I_1$ | $I_2$ | VDD/Gnd Up | VDD/Gnd Down | Half-VDD Up | Half-VDD Down |
|---|---|---|---|---|---|
| 1 | 0 | 0 | 0 | 1 | 1 |
| 1 | 1 | 1 | 0 | X | 0 |
| 1 | 2 | 0 | 0 | 1 | 1 |
| 2 | 0 | 0 | 1 | 0 | X |
| 2 | 1 | 0 | 0 | 1 | 1 |
| 2 | 2 | 0 | 1 | 0 | X |

Next, minimization may be performed using the Quine-McCluskey algorithm. When the pull-up/pull-down table in Table 11 is provided as an input of the algorithm, the minimization process is performed, such that SOPs for pull-up/pull-down networks of a drain-ground path are $A_1B_1$ and $A_0B_0+A_2B_2+A_2B_0+A_2B_2$, and SOPs for pull-up/pull-down networks of a half drain path are $A_1+B_1$ and $A_0+B_2+A_2+B_0$. Next, through the SOP optimization and transistor mapping operations, the second counting gate may be designed at a transistor level.

FIGS. 11A to 11F illustrate multiplication gates designed at a transistor level.

Figure 11A:
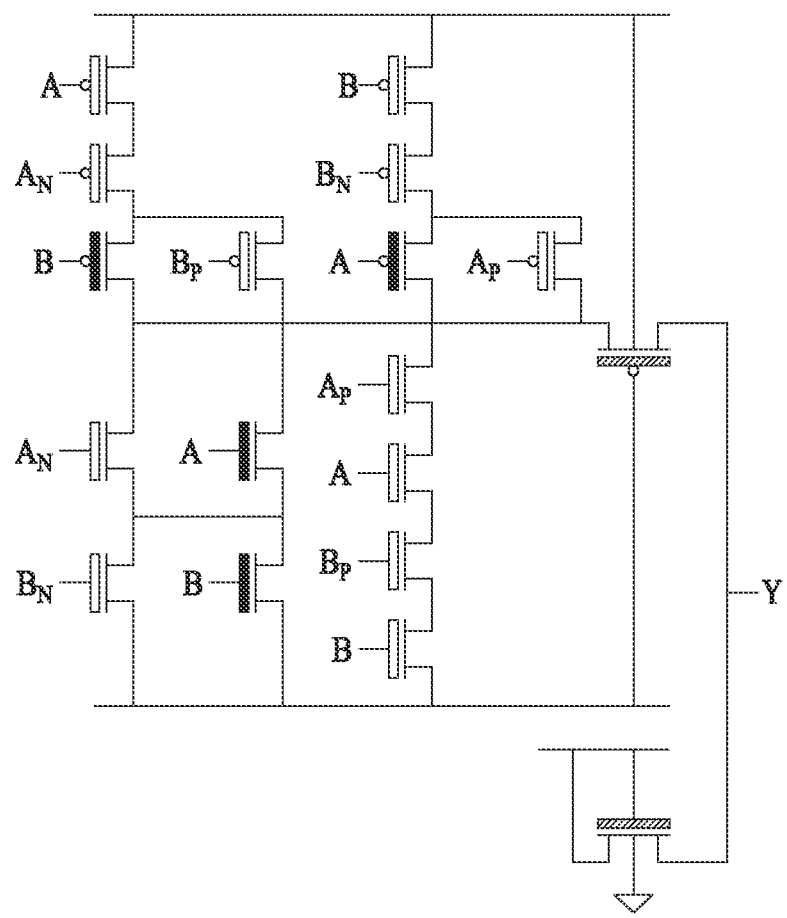
FIGS. 11A to 11F illustrate multiplication gates designed at a transistor level.

FIG. 11A illustrates a first multiplication gate (B0 gate) designed at a transistor level. Table 12 is a pull-up/pull-down table generated from a truth table for the first multiplication gate.

TABLE 12

| $I_1$ | $I_2$ | VDD/Gnd Up | VDD/Gnd Down | Half-VDD Up | Half-VDD Down |
|---|---|---|---|---|---|
| 0 | 0 | 0 | 0 | 1 | 1 |
| 0 | 1 | 1 | 0 | X | 0 |
| 0 | 2 | 0 | 0 | 1 | 1 |
| 1 | 0 | 1 | 0 | X | 0 |
| 1 | 1 | 0 | 0 | 1 | 1 |
| 1 | 2 | 1 | 0 | X | 0 |
| 2 | 0 | 0 | 0 | 1 | 1 |
| 2 | 1 | 1 | 0 | X | 0 |
| 2 | 2 | 0 | 0 | 1 | 1 |

Next, minimization may be performed using the Quine-McCluskey algorithm. When the pull-up/pull-down table in Table 12 is provided as an input of the algorithm, the minimization process is performed, such that SOPs for pull-up/pull-down networks of a drain-ground path are $A_1*(B_0+B_2)+B_1*(A_0+A_2)$ and "0", and SOPs for pull-up/pull-down networks of a half drain path are "1" and $(A_0+A_2)*(B_0+B_2)+A_1*B_1$. Next, through the SOP optimization and transistor mapping operations, the first multiplication gate may be designed at a transistor level.

Figure 11B:
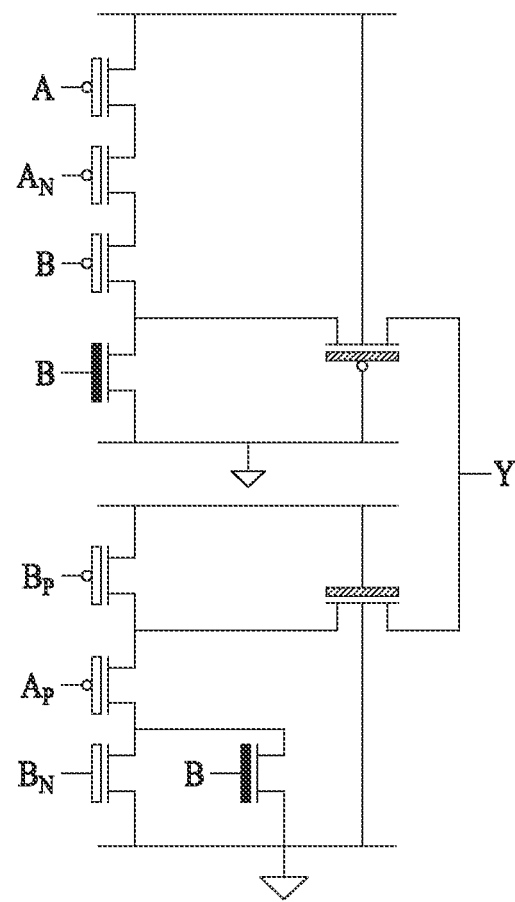

FIG. 11B illustrates a second multiplication gate (B1 gate) designed at a transistor level. Table 13 is a pull-up/pull-down table generated from a truth table for the second multiplication gate.

TABLE 13

| $I_1$ | $I_2$ | VDD/Gnd Up | VDD/Gnd Down | Half-VDD Up | Half-VDD Down |
|---|---|---|---|---|---|
| 0 | 0 | 0 | 1 | 0 | X |
| 0 | 1 | 0 | 1 | 0 | X |
| 0 | 2 | 0 | 0 | 1 | 1 |
| 1 | 0 | 1 | 0 | X | 0 |
| 1 | 1 | 1 | 0 | X | 0 |
| 1 | 2 | 0 | 0 | 1 | 1 |
| 2 | 0 | 0 | 1 | 0 | X |

TABLE 13-continued

| $I_1$ | $I_2$ | VDD/Gnd Up | VDD/Gnd Down | Half-VDD Up | Half-VDD Down |
|---|---|---|---|---|---|
| 2 | 1 | 0 | 1 | 0 | X |
| 2 | 2 | 0 | 0 | 1 | 1 |

Next, minimization may be performed using the Quine-MDCluskey algorithm. When the pull-up/pull-down table in Table 13 is provided as an input of the algorithm, the minimization process is performed, such that SOPs for pull-up/pull-down networks of a drain-ground path are $A_1*(B_0+B_1)$ and $(A_0+A_1)*(B_0+B_2)$, and SOPs for pull-up/pull-down networks of a half drain path are $B_2$ and $B_2$. Next, through the SOP optimization and transistor mapping operations, the second multiplication gate may be designed at a transistor level.

Figure 11C:
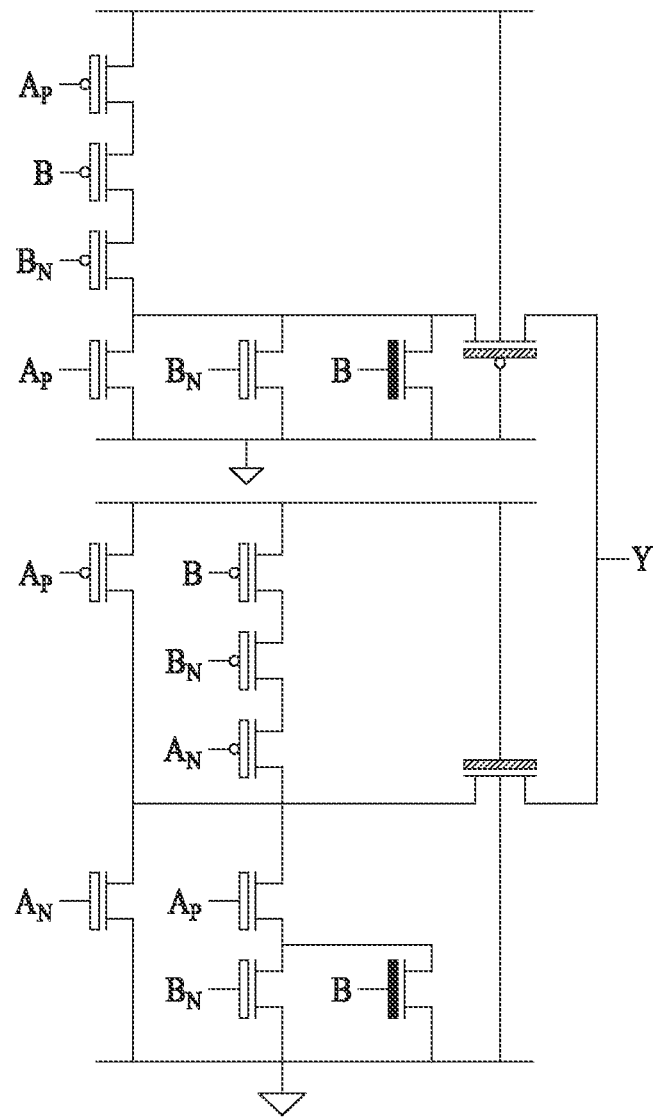

FIG. 11C illustrates a third multiplication gate (B32 gate) designed at a transistor level. Table 14 is a pull-up/pull-down table generated from a truth table for the third multiplication gate.

TABLE 14

| $I_1$ | $I_2$ | VDD/Gnd Up | VDD/Gnd Down | Half-VDD Up | Half-VDD Down |
|---|---|---|---|---|---|
| 0 | 0 | 0 | 1 | 0 | X |
| 0 | 1 | 0 | 1 | 0 | X |
| 0 | 2 | 0 | 1 | 0 | X |
| 1 | 0 | 0 | 1 | 0 | X |
| 1 | 1 | 0 | 0 | 1 | 1 |
| 1 | 2 | 0 | 1 | 0 | X |
| 2 | 0 | 0 | 0 | 1 | 1 |
| 2 | 1 | 1 | 0 | X | 0 |
| 2 | 2 | 0 | 0 | 1 | 1 |

Next, minimization may be performed using the Quine-MDCluskey algorithm. When the pull-up/pull-down table in Table 14 is provided as an input of the algorithm, the minimization process is performed, such that SOPs for pull-up/pull-down networks of a drain-ground path are $A_2-B_1$ and $A_0+(A_0+A_1)*(B_0+B_1)$, and SOPs for pull-up/pull-down networks of a half drain path are $A_2+B_1*(A_1+A_2)$ and $(A_0+A_1)+B_0+B_2$. Next, through the SOP optimization and transistor mapping operations, the third multiplication gate may be designed at a transistor level.

Figure 11D:
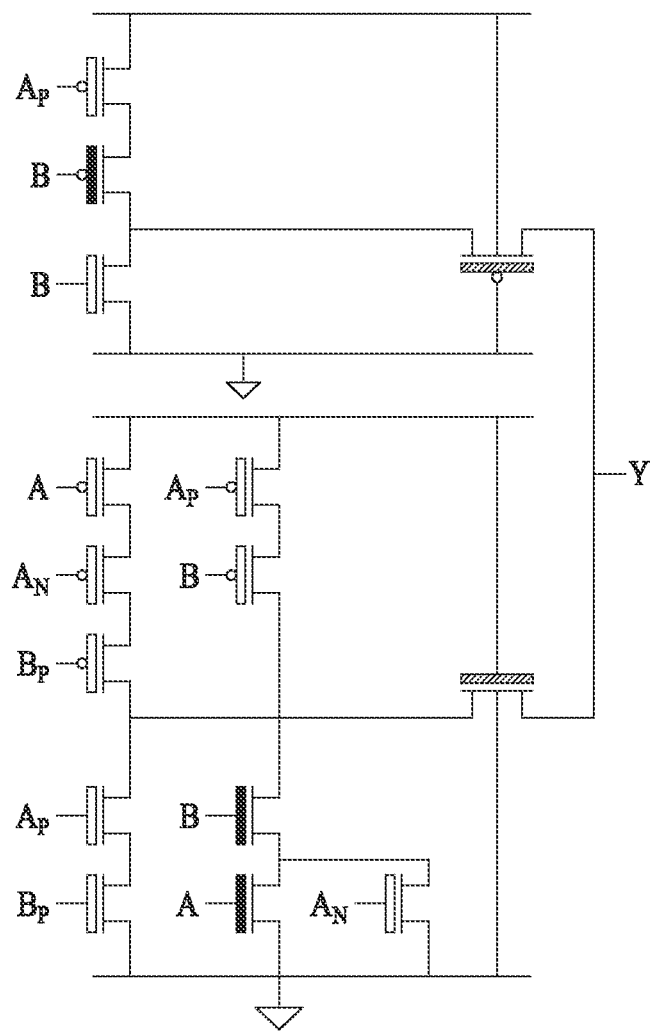

FIG. 11D illustrates a fourth multiplication gate designed at a transistor level. Table 15 is a pull-up/pull-down table generated from a truth table for the fourth multiplication gate.

TABLE 15

| $I_1$ | $I_2$ | VDD/Gnd Up | VDD/Gnd Down | Half-VDD Up | Half-VDD Down |
|---|---|---|---|---|---|
| 0 | 0 | 0 | 1 | 0 | X |
| 0 | 1 | 0 | 1 | 0 | X |
| 0 | 2 | 0 | 1 | 0 | X |
| 1 | 0 | 0 | 1 | 0 | X |
| 1 | 1 | 0 | 1 | 0 | X |
| 1 | 2 | 0 | 0 | 1 | 1 |
| 2 | 0 | 1 | 0 | X | 0 |
| 2 | 1 | 0 | 0 | 1 | 1 |
| 2 | 2 | 0 | 1 | 0 | X |

Next, minimization may be performed using the Quine-MDCluskey algorithm. When the pull-up/pull-down table in Table 15 is provided as an input of the algorithm, the minimization process is performed, such that SOPs for pull-up/pull-down networks of a drain-ground path are $A_2-B_0$ and $(A_0+A_1)*(B_0+B_1)+B_2(A_0+A_2)$, and SOPs for pull-up/pull-down networks of a half drain path are $A_1*B_2+A_2*(B_0+B_1)$ and $B_1+B_2$. Next, through the SOP optimization and transistor mapping operations, the fourth multiplication gate may be designed at a transistor level.

Figure 11E:
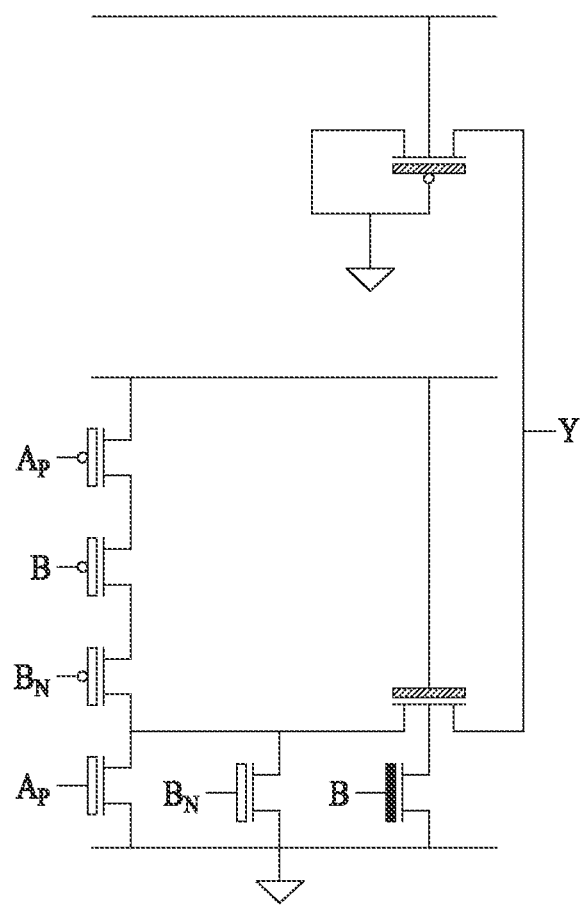

FIG. 11E illustrates a fifth multiplication gate designed at a transistor level. Table 16 is a pull-up/pull-down table generated from a truth table for the fifth multiplication gate.

TABLE 16

| $I_1$ | $I_2$ | VDD/Gnd Up | VDD/Gnd Down | Half-VDD Up | Half-VDD Down |
|---|---|---|---|---|---|
| 0 | 0 | 0 | 1 | 0 | X |
| 0 | 1 | 0 | 1 | 0 | X |
| 0 | 2 | 0 | 1 | 0 | X |
| 1 | 0 | 0 | 1 | 0 | X |
| 1 | 1 | 0 | 1 | 0 | X |
| 1 | 2 | 0 | 1 | 0 | X |
| 2 | 0 | 0 | 1 | 0 | X |
| 2 | 1 | 0 | 0 | 1 | 1 |
| 2 | 2 | 0 | 1 | 0 | X |

Next, minimization may be performed using the Quine-McCluskey algorithm. When the pull-up/pull-down table in Table 16 is provided as an input of the algorithm, the minimization process is performed, such that SOPs for pull-up/pull-down networks of a drain-ground path are "0" and $A_0+A_1+(B_0+B_2)$, and SOPs for pull-up/pull-down networks of a half drain path are $A_2*B_2$ and "1". Next, through the SOP optimization and transistor mapping operations, the fifth multiplication gate may be designed at a transistor level.

Figure 11F:
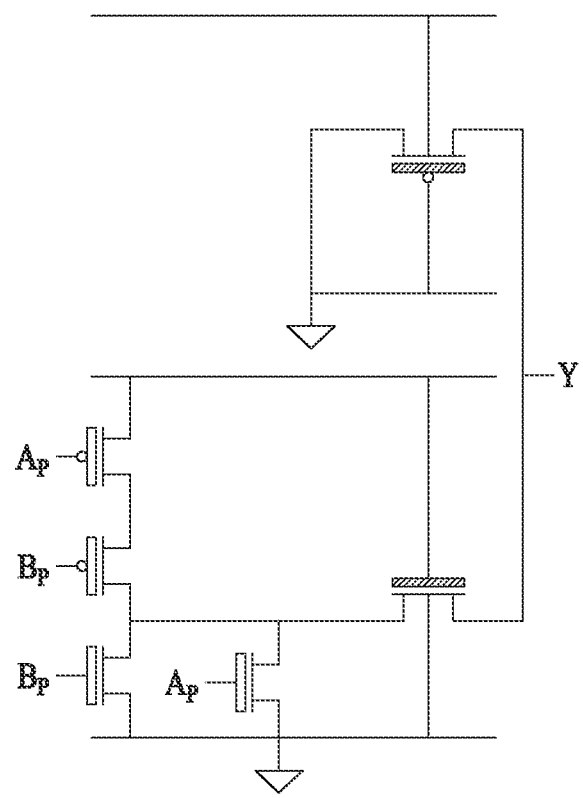

FIG. 11F illustrates a sixth multiplication gate designed at a transistor level. Table 17 is a pull-up/pull-down table generated from a truth table for the sixth multiplication gate.

TABLE 17

| I | $I_2$ | VDD/Gnd Up | VDD/Gnd Down | Half-VDD Up | Half-VDD Down |
|---|---|---|---|---|---|
| 0 | 0 | 0 | 1 | 0 | X |
| 0 | 1 | 0 | 1 | 0 | X |
| 0 | 2 | 0 | 1 | 0 | X |
| 1 | 0 | 0 | 1 | 0 | X |
| 1 | 1 | 0 | 1 | 0 | X |
| 1 | 2 | 0 | 1 | 0 | X |
| 2 | 0 | 0 | 1 | 0 | X |
| 2 | 1 | 0 | 1 | 0 | X |
| 2 | 2 | 0 | 0 | 1 | 1 |

Next, minimization may be performed using the Quine-McCluskey algorithm. When the pull-up/pull-down table in Table 17 is provided as an input of the algorithm, the minimization process is performed, such that SOPs for pull-up/pull-down networks of a drain-ground path are "0" and $A_0+A_1+(B_0+B_2)$, and SOPs for pull-up/pull-down networks of a half drain path are $A_2*B_2$ and "1". Next, through the SOP optimization and transistor mapping operations, the sixth multiplication gate may be designed at a transistor level.

Figure 12:
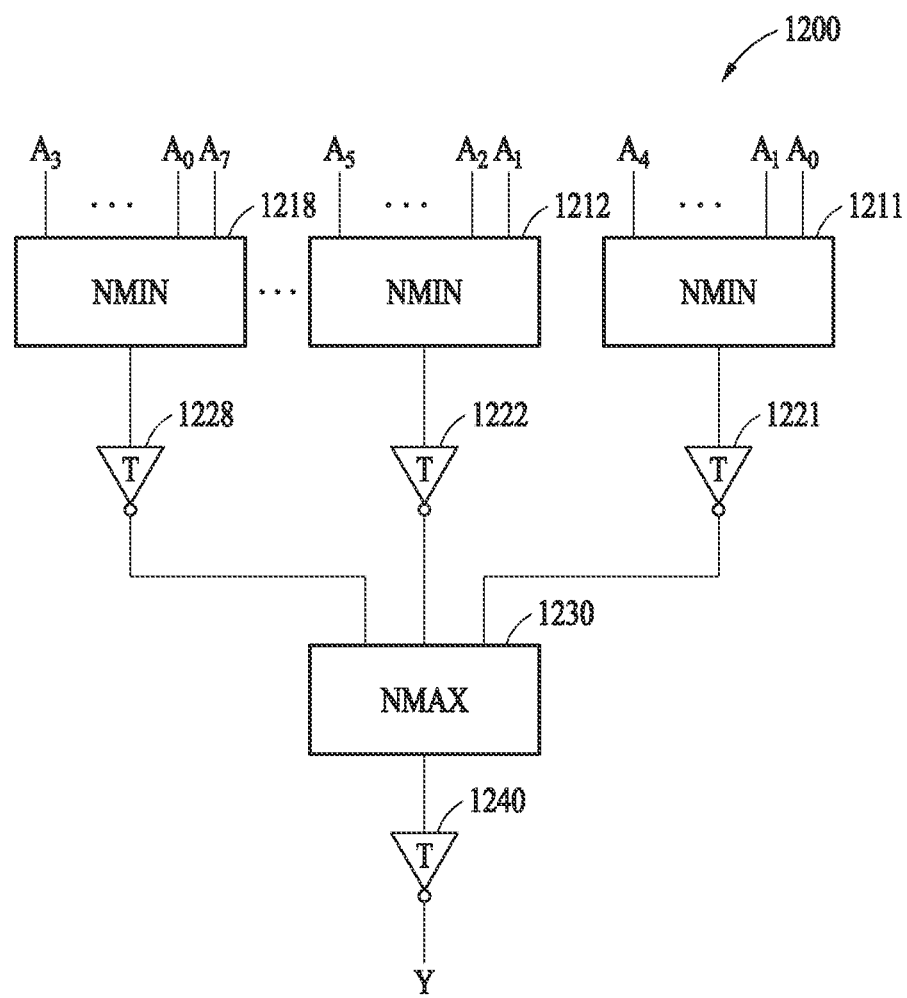
FIG. 12 illustrates a ternary cyclic circuit according to an example embodiment.

FIG. 12 illustrates a ternary cyclic circuit according to an example embodiment.

A ternary cyclic circuit may perform an operation of calculating a maximum value of minimum values of logical values calculated for input signal sets each including a predetermined number of input signals among a plurality of input signals applied thereto. The following Equation 7 shows a function expression implemented by the ternary cyclic circuit.

$$_i cy_j = \bigvee_{m=0}^{i-1} \left( \bigwedge_{n=0}^{j-1} x(m+n) \bmod i \right) (\text{base } 3) \qquad \text{[Equation 7]}$$

In Equation 7, i denotes the number of input signals applied to the ternary cyclic circuit, and j denotes the predetermined number. According to Equation 7, i input signal sets cyclically including j signals out of i input signals applied to the ternary cyclic circuit may be generated. $_i cy_j$ denotes a maximum value of minimum values of logical values calculated for the i input signal sets. Hereinafter, a ternary cyclic circuit 1200 to which eight input signals are applied will be described.

The ternary cyclic circuit 1200 may receive eight input signals (e.g., $A_0$ to $A_7$). The ternary cyclic circuit 1200 may include eight NMIN gates 1211 to 1218. An NMIN gate is a ternary logic gate capable of performing an operation according to Equation 8 below.

$$Y(A_0, A_1, \ldots, A_m) = \begin{cases} 2 & \text{if } \min(A_0, A_1, \ldots, A_m) = 0 \\ 1 & \text{if } \min(A_0, A_1, \ldots, A_m) = 1 \\ 0 & \text{if } \min(A_0, A_1, \ldots, A_m) = 2 \end{cases} \qquad \text{[Equation 8]}$$

An NMIN gate may output a drain voltage when a minimum voltage among a plurality of input signals applied thereto is a ground voltage, output a half drain voltage when the minimum voltage among the plurality of input signals applied thereto is a half drain voltage, and output a ground voltage when the minimum voltage among the plurality of input signals applied thereto is a drain voltage. In summary, the NMIN gate may output an inverting voltage of the minimum voltage among the plurality of input signals applied thereto.

A predetermined number of input signals among the plurality of input signals $A_0$ to $A_7$ may be cyclically applied to the NMIN gates 1211 to 1218. For example, referring to FIG. 10, the predetermined number may be "5". The input signals $A_0$, $A_1$, $A_2$, $A_3$, and $A_4$ may be applied to the NMIN gate 1211, and the input signals $A_1$, $A_2$, $A_3$, $A_4$, and $A_5$ may be applied to the NMIN gate 1212. The input signals $A_7$, $A_0$, $A_1$, $A_2$, and $A_3$ may be applied to the NMIN gate 1218.

The ternary cyclic circuit 1200 may further include a plurality of standard ternary inverters (STIs; hereinafter, "inverters") that are respectively connected to the plurality of NMIN gates 1211 to 1218. For example, an inverter 1221 may be connected to the NMIN gate 1211 and receive the output signal of the NMIN gate 1211. An inverter 1222 may be connected to the NMIN gate 1212 and receive the output signal of the NMIN gate 1212. The inverters may perform operations according to a truth table described in Table 18 below.

TABLE 18

| Input | Output |
|---|---|
| 0(GND) | 2 |
| 1($V_{DD}/2$) | 1 |
| 2($V_{DD}$) | 0 |

Consequently, each of the inverters 1221 to 1228 in the ternary cyclic circuit 1200 may output a voltage corresponding to a minimum logical value among the logical values indicated by the input signals applied to the corresponding NMIN gate.

The ternary cyclic circuit 1200 may further include an NMAX gate 1230 that receives all the output signals of the plurality of inverters 1221 to 1228. The NMAX gate 1230 is a ternary logic gate capable of performing an operation according to Equation 9 below.

$$Y(A_0, A_1, \ldots, A_m) = \begin{cases} 2 & \text{if } \max(A_0, A_1, \ldots, A_m) = 0 \\ 1 & \text{if } \max(A_0, A_1, \ldots, A_m) = 1 \\ 0 & \text{if } \max(A_0, A_1, \ldots, A_m) = 2 \end{cases} \quad \text{[Equation 9]}$$

The NMAX gate may output a drain voltage when a maximum voltage among a plurality of input signals applied thereto is a ground voltage, output a half drain voltage when the maximum voltage among the plurality of input signals applied thereto is a half drain voltage, and output a ground voltage when the maximum voltage among the plurality of input signals applied thereto is a drain voltage. In summary, the NMAX gate may output an inverting voltage of the maximum voltage among the plurality of input signals applied thereto. The ternary cyclic circuit 1200 may further include an inverter 1240 connected to the NMAX gate 1230. Consequently, the inverter 1240 in the ternary cyclic circuit 1200 may output, as an output signal of the ternary cyclic circuit 1200, a voltage corresponding to the maximum logical value among the logical values indicated by the input signals applied to the NMAX gate 1230.

The NMIN gates, the NMAX gate, and the inverters included in the ternary cyclic circuit 1200 may be designed at a transistor level through the pull-up/pull-down table generation, Quine-McCluskey algorithm application, SOP optimization, and transistor mapping operations proposed above.

The units described herein may be implemented using a hardware component, a software component and/or a combination thereof. A processing device may be implemented using one or more general-purpose or special-purpose computers, such as, for example, a processor, a controller and an arithmetic logic unit (ALU), a DSP, a microcomputer, an FPGA, a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, the processing device may include a plurality of processors, or a single processor and a single controller. In addition, different processing configurations are possible, such as parallel processors.

The software may include a computer program, a piece of code, an instruction, or some combination thereof, to independently or uniformly instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network-coupled computer systems so that the software is stored and executed in a distributed fashion. The software and data may be stored by one or more non-transitory computer-readable recording mediums.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher-level code that may be executed by the computer using an interpreter.

The above-described devices may be configured to act as one or more software modules in order to perform the operations of the above-described examples, or vice versa.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

What is claimed is:

1. A circuit comprising:
    a plurality of first counting gates;
    a first ternary half adder (THA) and a second THA that are connected to the plurality of first counting gates;
    a third THA configured to receive a sum output signal of the first THA and a sum output signal of the second THA;
    a first ternary sum gate configured to receive a carry output signal of the first THA and a carry output signal of the second THA; and
    a second ternary sum gate configured to receive a carry output signal of the third THA and an output signal of the first ternary sum gate,
    wherein the third THA and the second ternary sum gate are configured to output voltage signals corresponding to a number of drain voltages among input signals applied to the plurality of first counting gates.

2. The circuit of claim 1, wherein each of the plurality of first counting gates is configured to:
    output a ground voltage when both input signals applied to the corresponding first counting gate are not drain voltages,
    output a drain voltage when both the input signals applied to the corresponding first counting gate are drain voltages, and output a half drain voltage when only one of the two input signals applied to the corresponding first counting gate is a drain voltage.

3. The circuit of claim 1, further comprising:
a plurality of second counting gates;
a fourth THA and a fifth THA that are connected to the plurality of second counting gates;
a sixth THA configured to receive a sum output signal of the fourth THA and a sum output signal of the fifth THA;
a third ternary sum gate configured to receive a carry output signal of the fourth THA and a carry output signal of the fifth THA; and
a fourth ternary sum gate configured to receive a carry output signal of the sixth THA and an output signal of the third ternary sum gate.

4. The circuit of claim 3, wherein each of the plurality of second counting gates is configured to:
output a ground voltage when both input signals applied to the corresponding second counting gate are not half drain voltages,
output a drain voltage when both the input signals applied to the corresponding second counting gate are half drain voltages, and
output a half drain voltage when only one of the two input signals applied to the corresponding second counting gate is a half drain voltage.

5. The circuit of claim 1, further comprising:
a first multiplication gate, a second multiplication gate, a third multiplication gate, a fourth multiplication gate, a fifth multiplication gate, and a sixth multiplication gate,
wherein the first multiplication gate, the second multiplication gate, the third multiplication gate, the fourth multiplication gate, the fifth multiplication gate, and the sixth multiplication gate are configured to receive a sum output signal of the third THA and an output signal of the second ternary sum gate.

6. The circuit of claim 5, further comprising:
an NNMIN gate configured to receive a plurality of input signals;
a first multiplexer configured to selectively output one of a ground voltage and an output signal of the first multiplication gate received as input signals, based on an output signal of the NNMIN gate received as a selected signal;
a second multiplexer configured to selectively output one of a ground voltage and an output signal of the second multiplication gate received as input signals, based on the output signal of the NNMIN gate received as the selected signal;
a third multiplexer configured to selectively output one of a ground voltage and an output signal of the third multiplication gate received as input signals, based on the output signal of the NNMIN gate received as the selected signal;
a fourth multiplexer configured to selectively output one of a ground voltage and an output signal of the fourth multiplication gate received as input signals, based on the output signal of the NNMIN gate received as the selected signal;
a fifth multiplexer configured to selectively output one of a ground voltage and an output signal of the fifth multiplication gate received as input signals, based on the output signal of the NNMIN gate received as the selected signal; and
a sixth multiplexer configured to selectively output one of a ground voltage and an output signal of the sixth multiplication gate received as input signals, based on the output signal of the NNMIN gate received as the selected signal.

7. The circuit of claim 6, wherein the NNMIN gate is configured to:
output a ground voltage when a minimum voltage among a plurality of input signals applied to the NNMIN gate is a ground voltage, and
output a drain voltage when the minimum voltage among the plurality of input signals applied to the NNMIN gate is one of a half drain voltage and a drain voltage.

* * * * *